(12) United States Patent
Yun et al.

(10) Patent No.: US 11,348,930 B2
(45) Date of Patent: May 31, 2022

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Janggn Yun, Suwon-si (KR); Jaeduk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 163 days.

(21) Appl. No.: 16/668,222

(22) Filed: Oct. 30, 2019

(65) Prior Publication Data

US 2020/0350326 A1 Nov. 5, 2020

(30) Foreign Application Priority Data

May 3, 2019 (KR) .......................... 10-2019-0052383

(51) Int. Cl.
| | |
|---|---|
| *H01L 27/11548* | (2017.01) |
| *H01L 27/11524* | (2017.01) |
| *H01L 27/11556* | (2017.01) |
| *H01L 27/11582* | (2017.01) |
| *H01L 27/11575* | (2017.01) |
| *H01L 27/11519* | (2017.01) |

(Continued)

(52) U.S. Cl.
CPC .... *H01L 27/11548* (2013.01); *H01L 23/5226* (2013.01); *H01L 27/11519* (2013.01); *H01L 27/11556* (2013.01); *H01L 27/11565* (2013.01); *H01L 27/11575* (2013.01); *H01L 27/11582* (2013.01)

(58) Field of Classification Search
CPC ......... H01L 27/11548; H01L 27/11565; H01L 23/5226; H01L 27/11556; H01L 27/11582; H01L 27/11575; H01L 27/11519; H01L 27/11524; H01L 27/1157; H01L 27/11578; H01L 29/788; H01L 29/66825; H01L 29/42324
See application file for complete search history.

(56) References Cited

U.S. PATENT DOCUMENTS

| | | | | |
|---|---|---|---|---|
| 9,536,897 B2 * | 1/2017 | Yoo | ................... | H01L 27/11573 |
| 9,716,104 B2 * | 7/2017 | Kim | ....................... | H01L 28/00 |
| 9,842,855 B2 * | 12/2017 | Lee | ................... | H01L 29/66666 |

(Continued)

*Primary Examiner* — Shahed Ahmed
*Assistant Examiner* — Khatib A Rahman
(74) *Attorney, Agent, or Firm* — F. Chau & Associates, LLC

(57) ABSTRACT

A semiconductor device includes a substrate including a memory cell region and a connection region, a plurality of gate electrodes stacked on the substrate, a channel structure penetrating the plurality of gate electrodes and including a channel layer extending in a vertical direction perpendicular to an upper surface of the substrate in the memory cell region, a dummy channel structure penetrating the plurality of gate electrodes and including a dummy channel layer extending in the vertical direction in the connection region, a first semiconductor layer disposed between the substrate and a lowermost one of the plurality of gate electrodes and surrounding the channel structure in the memory cell region, and an insulating separation structure disposed between the substrate and the lowermost one of the plurality of gate electrodes and surrounding the dummy channel layer.

20 Claims, 45 Drawing Sheets

(51) Int. Cl.
    *H01L 27/11565*     (2017.01)
    *H01L 23/522*     (2006.01)

(56) References Cited

U.S. PATENT DOCUMENTS

| | | | |
|---|---|---|---|
| 10,103,169 B1 * | 10/2018 | Ge | H01L 27/11575 |
| 10,103,189 B2 | 10/2018 | Ge et al. | |
| 10,141,326 B1 | 11/2018 | Oh et al. | |
| 11,043,505 B2 * | 6/2021 | Zhu | H01L 25/0657 |
| 2012/0098139 A1 | 4/2012 | Chae et al. | |
| 2014/0264549 A1 * | 9/2014 | Lee | H01L 29/04 |
| | | | 257/324 |
| 2015/0054058 A1 * | 2/2015 | Seol | H01L 29/42332 |
| | | | 257/324 |
| 2016/0225785 A1 * | 8/2016 | Kim | H01L 27/11575 |
| 2017/0040337 A1 * | 2/2017 | Kim | H01L 27/11582 |
| 2017/0110543 A1 * | 4/2017 | Shin | H01L 29/1083 |
| 2017/0200676 A1 * | 7/2017 | Jeong | H01L 27/11556 |
| 2018/0122819 A1 | 5/2018 | Shim et al. | |
| 2018/0151872 A1 | 5/2018 | Choi et al. | |
| 2018/0240811 A1 | 8/2018 | Kim et al. | |

* cited by examiner

A1 - A1'

A2 - A2'

A1 - A1'

A1 - A1'

A1 - A1'

SEMICONDUCTOR DEVICE AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2019-0052383 filed on May 3, 2019 in the Korean Intellectual Property Office, the disclosure of which is incorporated by reference in its entirety herein.

TECHNICAL FIELD

Example embodiments of the present disclosure relate to a semiconductor device and a method of manufacturing the same, and more specifically, to a semiconductor device including a channel structure extending in a vertical direction and a method of manufacturing the same.

DISCUSSION OF RELATED ART

As integration of a memory device increases, a memory device having a vertical transistor structure may be more desirable than a memory device having a conventional planar transistor structure. The memory device of the vertical transistor structure includes a channel structure disposed on a substrate and extending in a vertical direction perpendicular to an upper surface of the substrate. However, as the number of gate electrodes stacked in the vertical direction is increased to increase an integration density of the memory device, it becomes increasingly difficult to manufacture the memory device.

SUMMARY

According to an exemplary embodiment of the inventive concepts, a semiconductor device includes a substrate including a memory cell region and a connection region; a plurality of gate electrodes stacked on the substrate; a channel structure disposed in the memory cell region and penetrating the plurality of gate electrodes, the channel structure including a channel layer extending in a vertical direction perpendicular to an upper surface of the substrate; a dummy channel structure disposed in the connection region and penetrating the plurality of gate electrodes, the dummy channel structure including a dummy channel layer extending in the vertical direction; a first semiconductor layer disposed in the memory cell region and disposed between the substrate and a lowermost one of the plurality of gate electrodes, the first semiconductor layer at least partially surrounding the channel structure; and an insulating separation structure disposed between the substrate and the lowermost one of the plurality of gate electrodes and at least partially surrounding the dummy channel layer.

According to an exemplary embodiment of the inventive concept, a semiconductor device includes a substrate including a memory cell region and a connection region; a plurality of gate electrodes stacked on the substrate; a channel structure disposed in the memory cell region and penetrating the plurality of gate electrodes, the channel structure including a channel layer and a gate insulation layer extending in a vertical direction perpendicular to an upper surface of the substrate; a dummy channel structure disposed in the connection region and penetrating the plurality of gate electrodes, the dummy channel structure including a dummy channel layer and a dummy gate insulation layer extending in the vertical direction; and a first semiconductor layer disposed in the memory cell region and disposed between the substrate and a lowermost one of the plurality of gate electrodes. A gate insulation layer separation region is formed at a lower portion of the channel structure. The first semiconductor layer at least partially surrounds the channel layer in the gate insulation layer separation region. The dummy gate insulation layer covers an outer sidewall of the dummy channel layer.

According to an exemplary embodiment of the inventive concept, a semiconductor device includes a substrate including a memory cell region and a connection region; a plurality of gate electrodes stacked on the substrate; a channel structure disposed in the memory cell region and penetrating the plurality of gate electrodes, the channel structure including a channel layer extending in a vertical direction perpendicular to an upper surface of the substrate; a dummy channel structure disposed in the connection region and penetrating the plurality of gate electrodes, the dummy channel structure including a dummy channel layer extending in the vertical direction; and a first semiconductor layer disposed in the memory cell region and disposed between the substrate and a lowermost one of the plurality of gate electrodes, the first semiconductor layer at least partially surrounding the channel structure. A gate insulation layer separation region is formed at a lower portion of the channel structure. The first semiconductor layer at least partially surrounds the channel layer in the gate insulation layer separation region. The dummy channel structure may be spaced apart from the first semiconductor layer.

According to an exemplary embodiment of the inventive concept, a method of manufacturing a semiconductor device include forming a substrate including a memory cell region and a connection region; forming a sacrificial layer on the memory cell region and an etch stop layer on the connection region; forming a mold stack on the sacrificial layer and the etch stop layer; forming a channel structure in the memory cell region and a dummy channel structure in the connection region, the channel structure and the dummy channel structure penetrating the mold stack; forming a word line cut opening penetrating the mold stack; removing a portion of the sacrificial layer in a region of the sacrificial layer that is exposed through the word line cut opening to expose a sidewall of the channel structure; and forming a first semiconductor layer in the region from which the sacrificial layer is removed. The channel structure includes a channel layer and a gate insulation layer. The dummy channel structure includes a dummy channel layer and a dummy gate insulation layer.

DETAILED DESCRIPTION OF THE EXEMPLARY EMBODIMENTS

Figure 1:
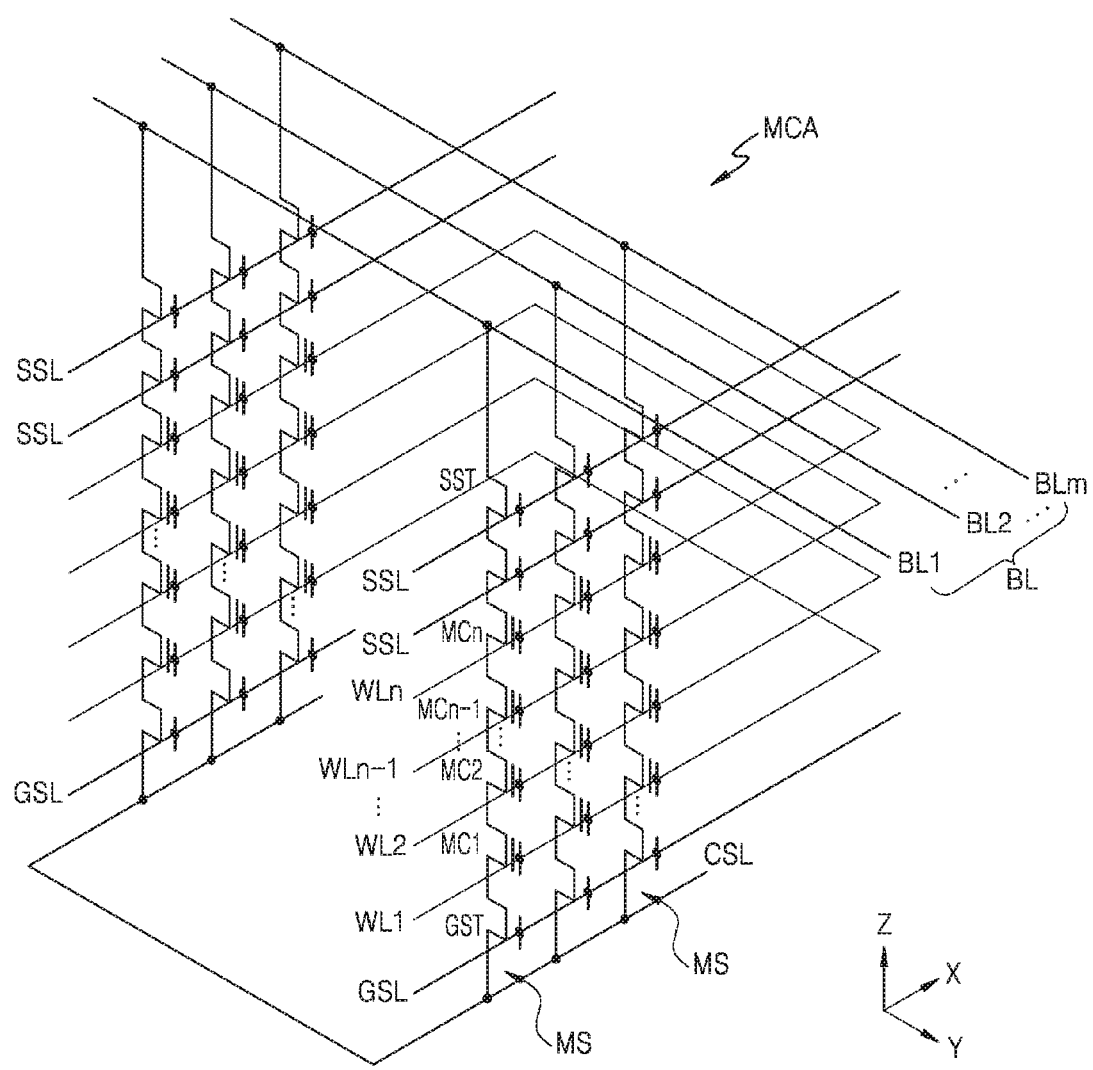
FIG. 1 is an equivalent circuit diagram of a memory cell array of a semiconductor device according to an exemplary embodiment of the inventive concept.

Exemplary embodiments of the inventive concept will now be described more fully hereinafter with reference to the accompanying drawings. Like reference numerals refer to like elements throughout this application.

FIG. 1 is an equivalent circuit diagram of a memory cell array of a semiconductor device according to an exemplary embodiment of the inventive concept, and more specifically, is an equivalent circuit diagram of a vertical type NAND (VNAND) flash memory device according to an exemplary embodiment of the inventive concept.

Referring to FIG. 1, a memory cell array MCA includes a plurality of memory cell strings MS that are arranged in a vertical direction (a Z direction of FIG. 1) on a substrate (not shown). The vertical direction (Z direction) may be perpendicular to a main surface of the substrate. Each of the plurality of memory cell strings MS may include a plurality of memory cells MC1, . . . , MCn-1, and MCn, a string select transistor SST, and a ground select transistor GST that are connected in series. The plurality of memory cells MC1, MC2, . . . , MCn-1, and MCn may store data. A plurality of word lines WL1, WL2, . . . , Wn-1, and Wn may be connected to the plurality of memory cells MC1, MC2, . . . , MCn-1, and MCn, respectively, to control corresponding ones of the plurality of memory cells MC1, MC2, . . . , MCn-1, and MCn.

A gate terminal of the ground select transistor GST may be connected to a ground select line GSL, and a source terminal of the ground select transistor GST may be connected to a common source line CSL. A gate terminal of the string select transistor SST may be connected to a string select line SSL. A source terminal of the string select transistor SST may be connected to a drain terminal of a corresponding one of the plurality of memory cells MCS. A drain terminal of the string select transistor SST may be connected to a corresponding one of a plurality of bit lines BL (BL1, BL2, . . . , and BLm). In FIG. 1, it is exemplarily illustrated that each of the memory cell strings MS includes one ground select transistor GST and two string select transistors SST, but the inventive concept is not limited thereto. For example, each of the memory cell strings MS may include one or three or more ground select transistors and one or three or more string select transistors.

When a signal is applied to the gate terminal of the string select transistor SST through the string select line SSL, a signal applied through the plurality of bit lines BL may be provided to the plurality of memory cells MC1, MC2, . . . , MCn-1, and MCn to perform a data write operation. When a signal is applied to the gate terminal of the ground select transistor GST through the ground select line GSL, an erase operation of the plurality of memory cells MC1, MC2, . . . , MCn-1, and MCn may be performed.

Figure 2:
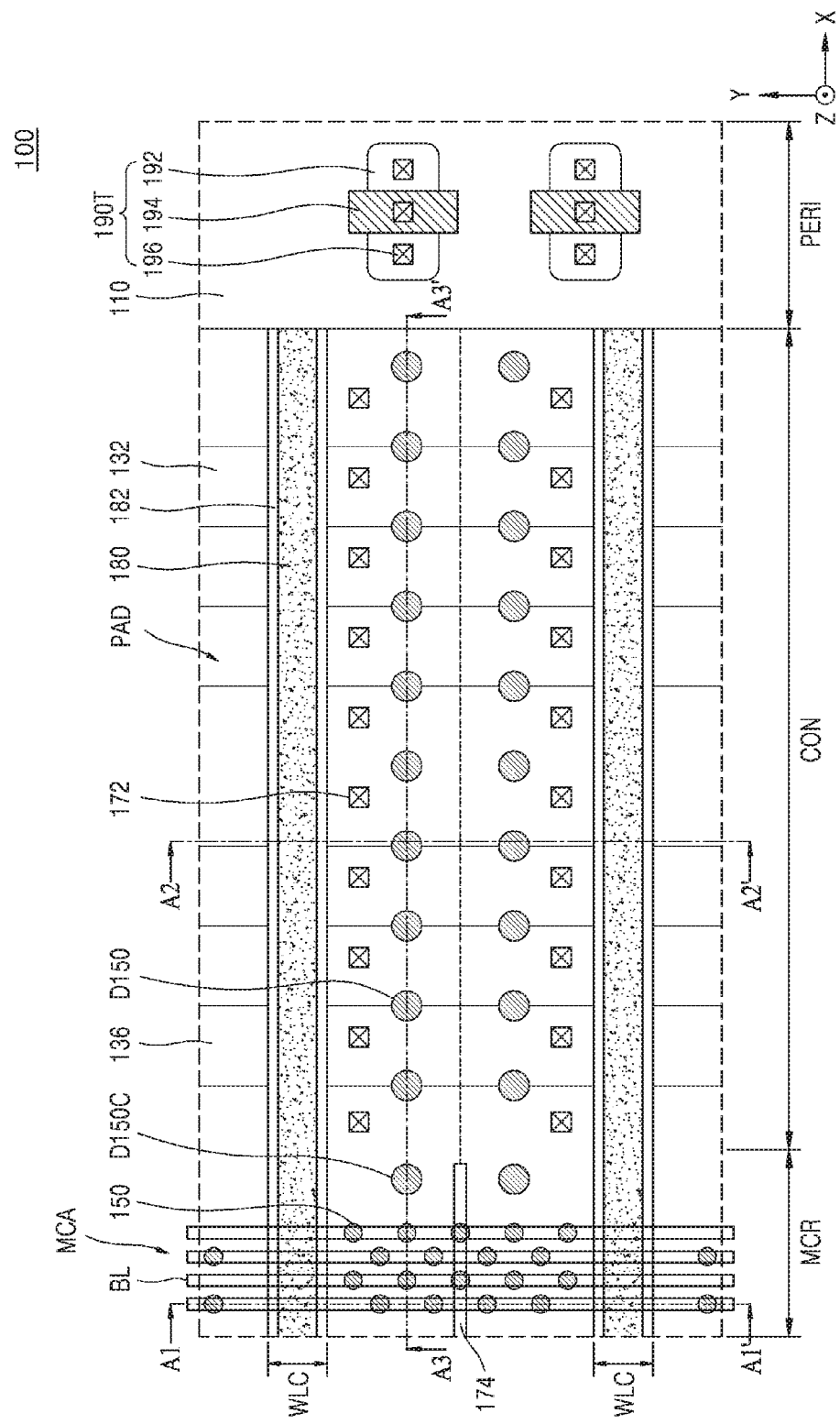
FIG. 2 is a plan view illustrating a representative configuration of a semiconductor device according to an exemplary embodiment of the inventive concept.
Figure 3:
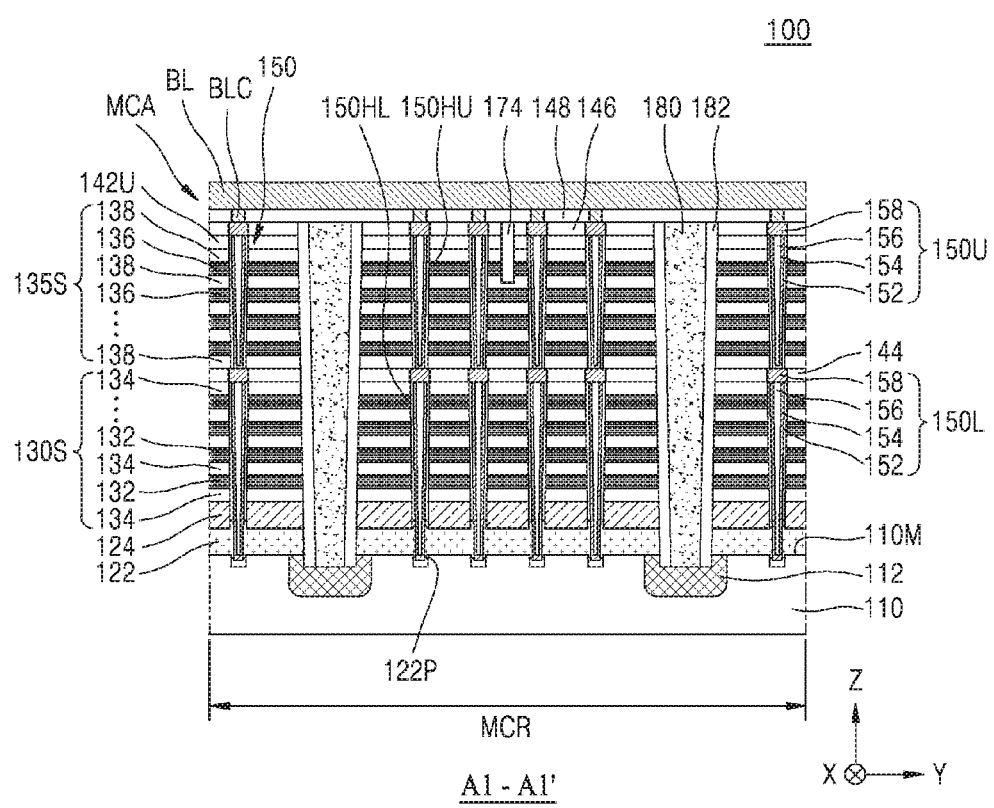
FIG. 3 is a cross-sectional view taken along line A1-A1' of FIG. 2.
Figure 4:
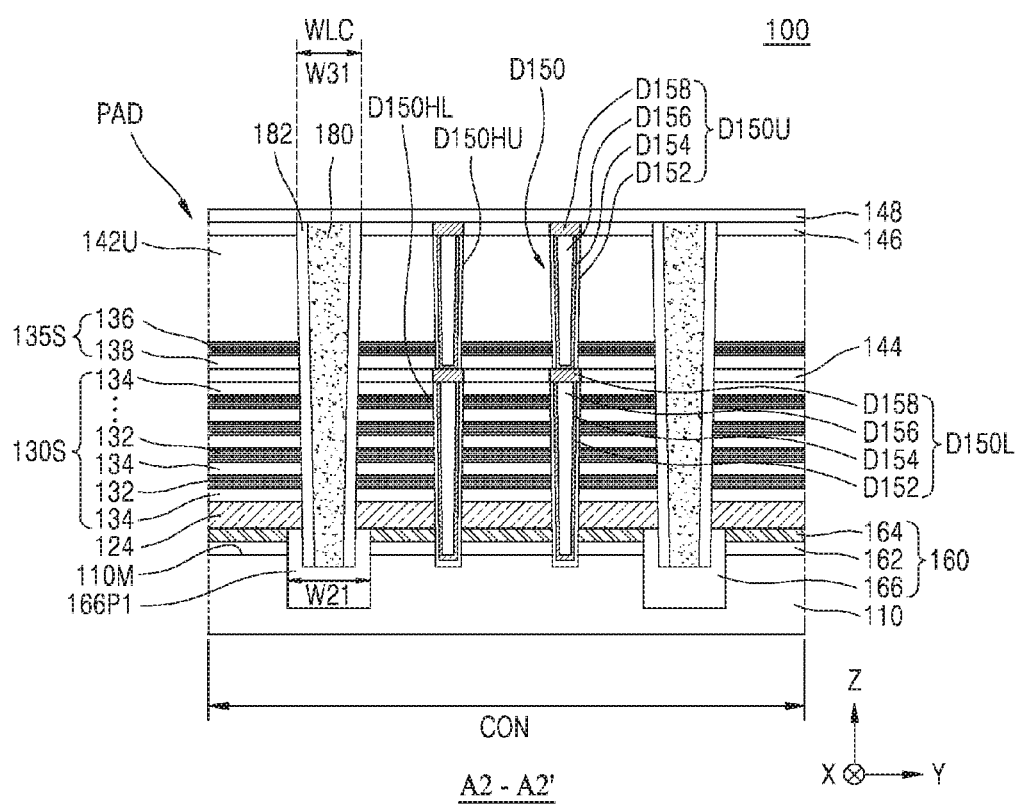
FIG. 4 is a cross-section view taken along line A2-A2' of FIG. 2.
Figure 5:
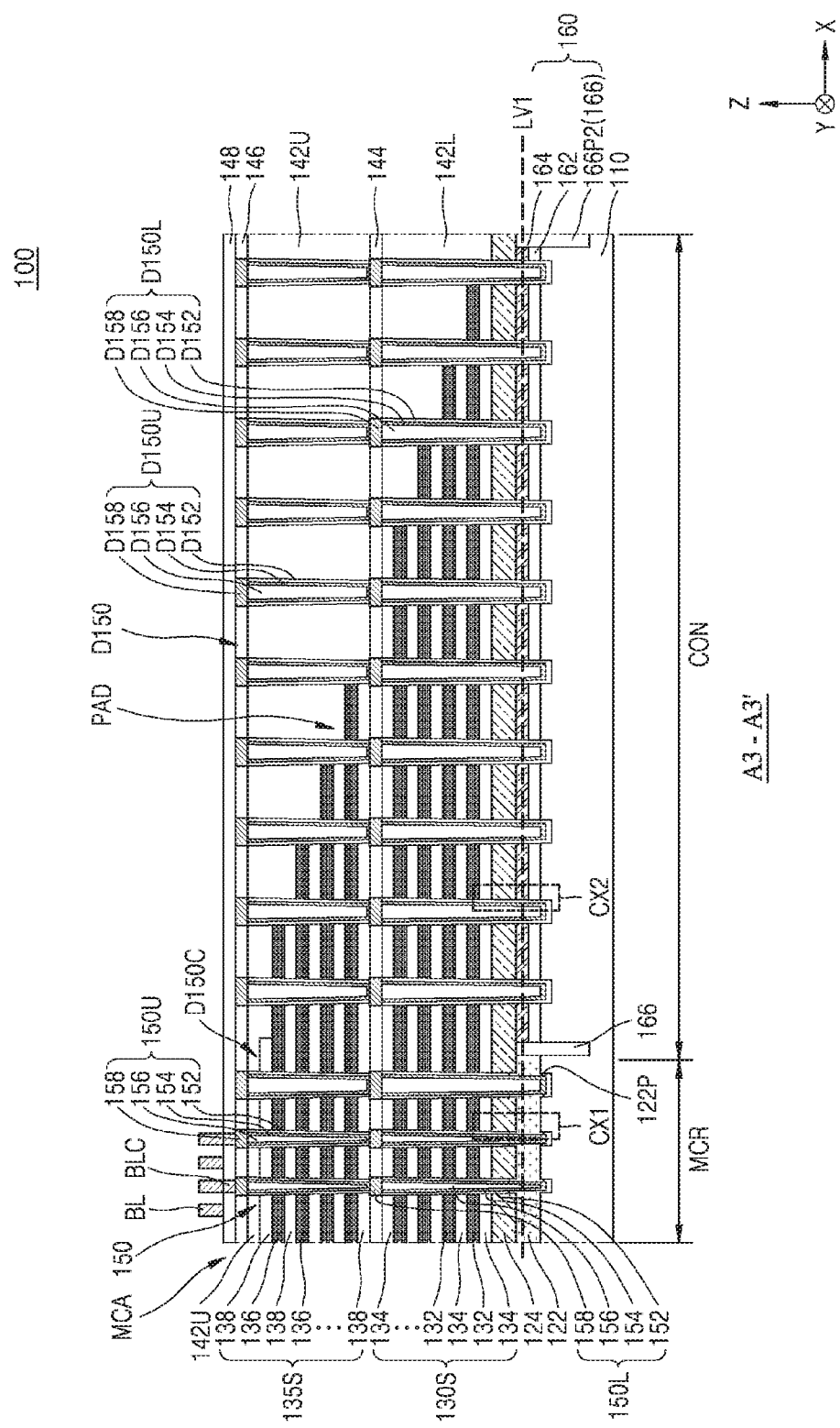
FIG. 5 is a cross-sectional view taken along line A3-A3' of FIG. 2.
Figure 6:
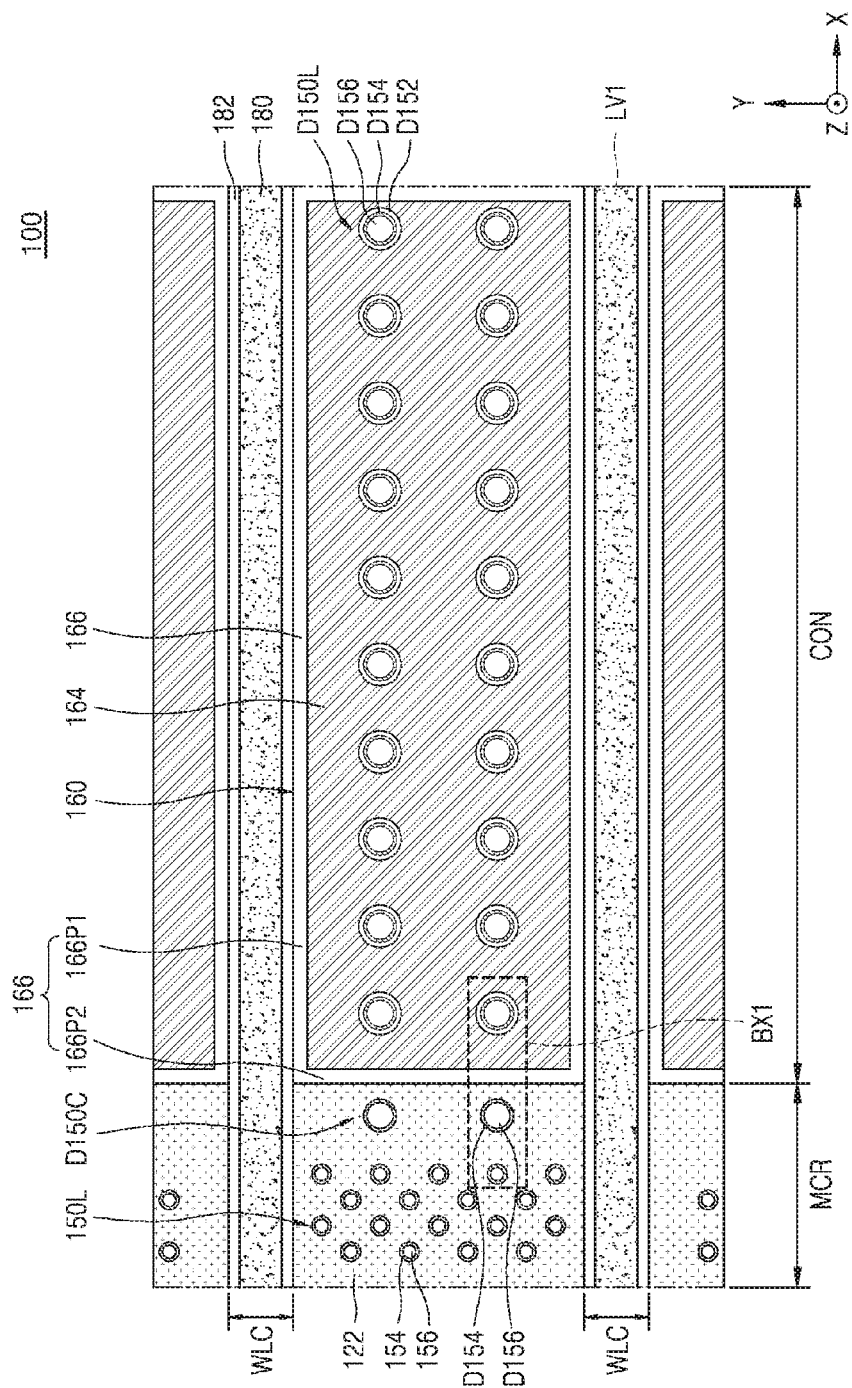
FIG. 6 is a horizontal cross-sectional view at a first vertical level LV1 of FIG. 5.
Figure 7:
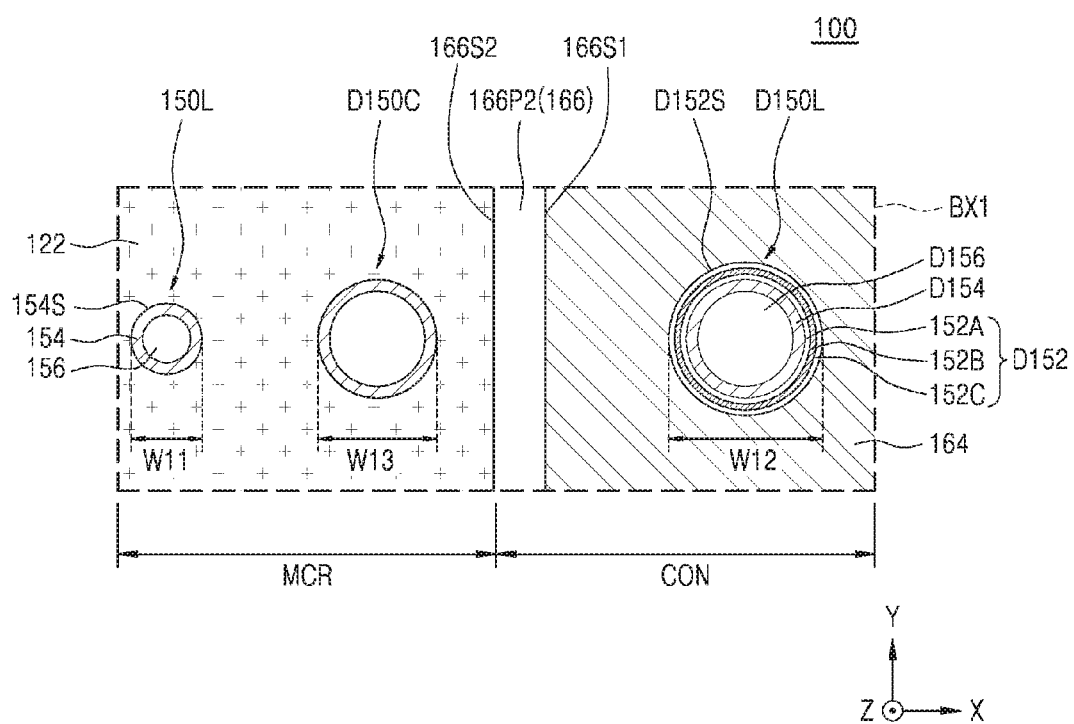
FIG. 7 is an enlarged view of portion BX1 of FIG. 6.
Figure 8:
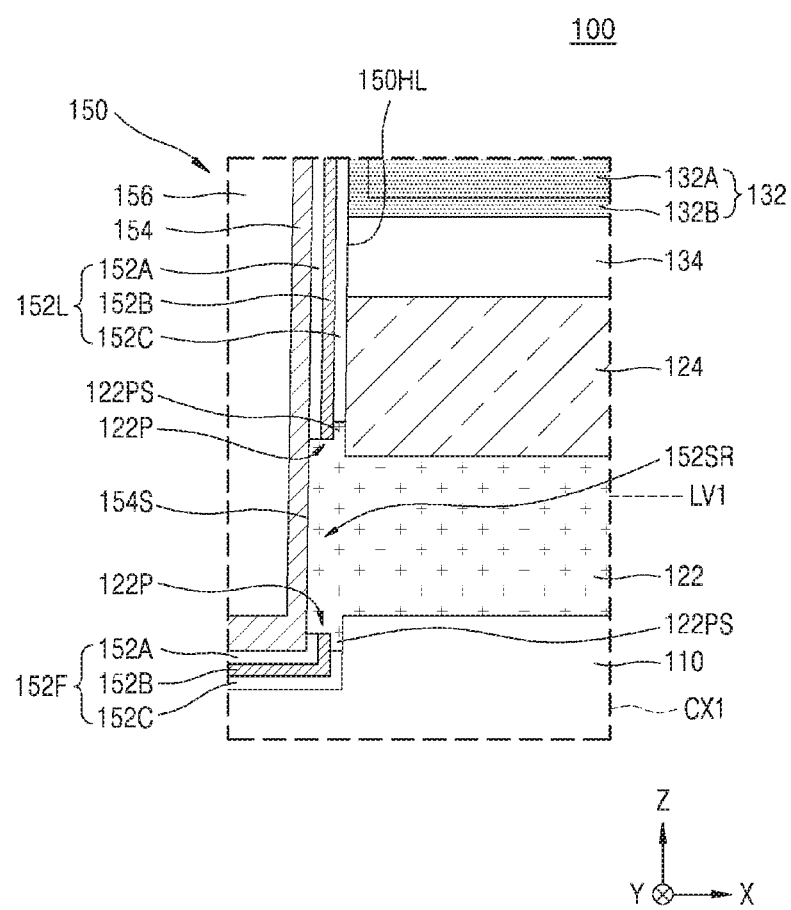
FIG. 8 is an enlarged view of portion CX1 of FIG. 5.
Figure 9:
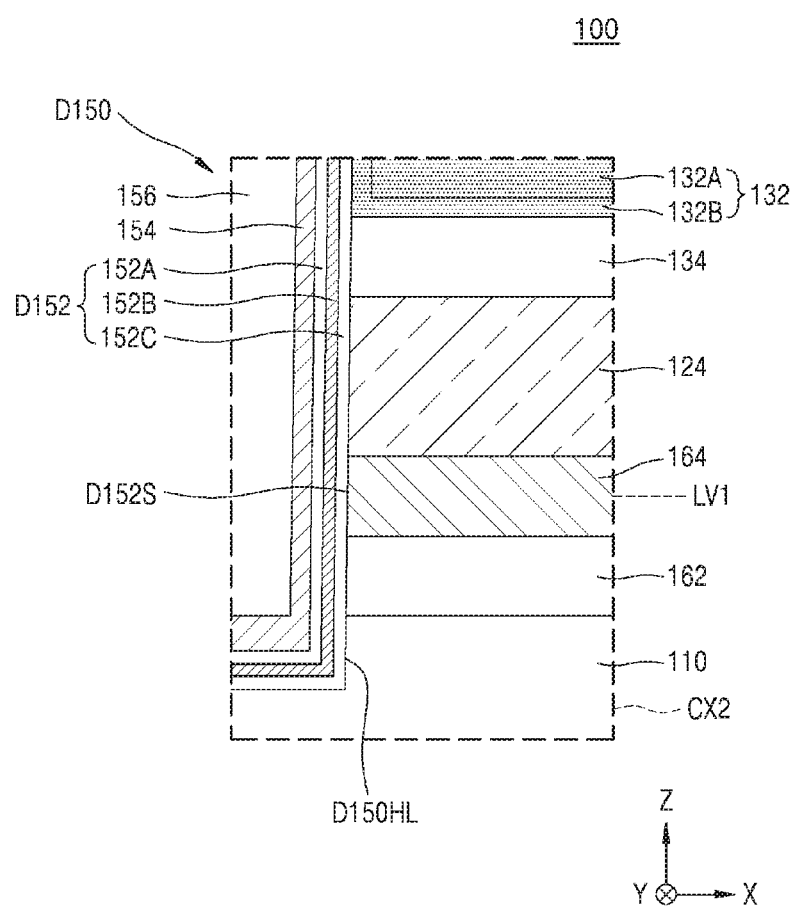
FIG. 9 is an enlarged view of portion CX2 of FIG. 5.

FIGS. 2 to 9 are views illustrating a semiconductor device according to an exemplary embodiment of the inventive concept. FIG. 2 is a plan view illustrating a representative configuration of a semiconductor device according to an exemplary embodiment of the inventive concept. FIG. 3 is a cross-sectional view taken along line A1-A1' of FIG. 2. FIG. 4 is a cross-section view taken along line A2-A2' of FIG. 2. FIG. 5 is a cross-sectional view taken along line A3-A3' of FIG. 2. FIG. 6 is a horizontal cross-sectional view at a first vertical level LV1 of FIG. 5. FIG. 7 is an enlarged view of portion BX1 of FIG. 6. FIG. 8 is an enlarged view of portion CX1 of FIG. 5. FIG. 9 is an enlarged view of portion CX2 of FIG. 5. In FIG. 2, some elements of the semiconductor device are illustrated for convenience of explanation and understanding.

Referring to FIGS. 2 to 9, in a semiconductor device 100 according to an exemplary embodiment, a substrate 110 includes a memory cell region MCR, a connection region CON, and a peripheral circuit region PERI. The connection region CON may be disposed between the memory cell region MCR and the peripheral circuit region PERI. A memory cell array MCA is disposed in the memory cell region MCR. The memory cell array MCA may be included in a NAND memory device of a vertical channel type structure operating in a manner as described with reference to FIG. 1. A peripheral circuit transistor 190T for driving the memory cell array MCA is disposed on the peripheral circuit region PERI. The peripheral circuit transistor 190T includes a peripheral circuit active region 192, a peripheral circuit gate electrode 194 disposed on the peripheral circuit active region 192, and a peripheral circuit contact 196 connected to the peripheral circuit active region 192 and the peripheral circuit gate electrode 194. The connection region CON may include a pad part PAD for connecting the memory cell array MCA in the memory cell region MCR and the peripheral circuit transistor 190T.

As shown in FIG. 3, the substrate 110 may include a main surface 110M extending in a first horizontal direction (an X direction) and a second horizontal direction (a Y direction). The main surface 110M of the substrate 110 may be, for example, an upper surface of the substrate 110. The first horizontal direction (X direction) and the second horizontal direction (Y direction) may be parallel to the main surface 110M of the substrate 110 and may be perpendicular to each other. The substrate 110 may include a semiconductor material, for example, a IV group semiconductor, a III-V group compound semiconductor, or a II-VI group oxide semiconductor. For example, the IV group semiconductor may include silicon (Si), germanium (Ge), or silicon-germanium (Si—Ge). The substrate 110 may be a bulk wafer or an epitaxial layer. In some embodiments, the substrate 110 may be a silicon-on-insulator (SOI) substrate or a germanium-on-insulator (GOI) substrate.

A first semiconductor layer 122 and a second semiconductor layer 124 are sequentially disposed in the memory cell region MCR of the substrate 110. The first semiconductor layer 122 and the second semiconductor layer 124 may extend in the first horizontal direction (X direction) and the second horizontal direction (Y direction). The first semiconductor layer 122 may include undoped or doped polysilicon, and the second semiconductor layer 124 may include undoped or doped polysilicon. The first semiconductor layer 122 may act as a common source line extension region and may correspond to a portion of the common source line CSL of FIG. 1. The first semiconductor layer 122 may be disposed on the main surface 110M.

A lower gate stack 130S is disposed on the substrate 110 and may extend in the first horizontal direction (X direction) and the second horizontal direction (Y direction). The lower gate stack 130S is disposed on the second semiconductor layer 124. The lower gate stack 130S includes a plurality of lower gate electrodes 132 and a plurality of lower insulation layers 134. The plurality of lower gate electrodes 132 and the plurality of lower insulation layers 134 may be alternately arranged in the vertical direction (Z direction) perpendicular to the main surface 110M of the substrate 110.

As shown in FIG. 8, in an exemplary embodiment, each of the lower gate electrodes 132 includes a buried conductive layer 132A and a conducive barrier layer 132B covering an upper surface, a lower surface, and a sidewall of the buried conductive layer 132A.

As shown in FIG. 3, an upper gate stack 135S is disposed on the lower gate stack 130S. The upper gate stack 135S includes a plurality of upper gate electrodes 136 and a plurality of upper insulation layers 138. The plurality of upper gate electrodes 136 and the plurality of upper insulation layers 138 may be alternately arranged along the vertical direction (Z direction). A first interlayer insulation layer 144 is disposed between the lower gate stack 130S and the upper gate stack 135S. For example, the first interlayer insulation layer 144 may contact a highest layer of the lower insulation layers 134 and a lowest layer of the upper insulation layers 138. A second interlayer insulation layer 146 and an upper interlayer insulation layer 148 may be sequentially disposed on the upper gate stack 135S. For example, the second insulation layer 146 may be disposed on the upper gate stack 135S. For example, the second insulation layer 146 may be disposed on a highest layer of the upper insulation layers 138.

In an exemplary embodiment, the plurality of lower gate electrodes 132 and the plurality of upper gate electrodes 136 correspond to the ground select line GSL, the word lines WL1, WL2, . . . , WLn-1, and WLn, and the string select line SSL that constitute the memory cell string MS, shown in FIG. 1. For example, a lowermost lower gate electrode 132 may act as the ground select line GSL, an uppermost upper gate electrode 136 may act as the string select line SSL, and the remainders of the lower gate electrodes 132 and the remainders of the upper gate electrodes 136 may act as the word lines WL1, WL2, . . . , WLn-1, and WLn. In some embodiments, an uppermost one of the remainders of the upper gate electrodes 136 act as a dummy word line. Thus, the memory cell string MS in which the ground select transistor GST, the string select transistor SST, and the memory cell transistors MC1, MC2, . . . , MCn-1, and MCn therebetween are connected in series may be provided.

As shown in FIG. 2, a plurality of word line cut regions WLC are disposed on the substrate 110 and may extend in the first horizontal direction (X direction). The lower gate stack 130S and the upper gate stack 135S disposed between a pair of the word cut regions WLC may constitute one block, and the pair of word line cut regions WLC may define a width of the lower gate stack 130S and the upper gate stack 135S in the second horizontal direction (Y direction).

A plurality of common source lines 180 vertically overlapped with the plurality of word line cut regions WLC, respectively, may each extend in the first horizontal direction (X direction) and may be arranged in the second horizontal direction (Y direction). Insulation spacers 182 may be disposed on opposite sidewalls of each of the plurality of common source lines 180. For example, each of the insulation spacers 182 may be disposed between each of the plurality of lower gate electrodes 132 and each of the plurality of the common source lines 180 and between each of the plurality of upper gate electrodes 136 and each of the plurality of the common source lines 180. The plurality of common source lines 180 may extend into the substrate 110 (or extend to a level lower than the main surface 110M of the substrate 110).

As shown in FIG. 3, a plurality of common source regions 112 may be disposed in the substrate 110 below the common source lines 180 and may be arranged in the second horizontal direction (Y direction). Each of the plurality of common source regions 112 may be a heavily doped n-type impurity region. Each of the plurality of common source regions 112 may act as a source region for supplying current to the memory cells. The plurality of common source regions 112 may be overlapped with the plurality of word line cut regions WLC, respectively. Each of the common source regions 112 may contact a portion of the first semiconductor layer 122, and thus the first semiconductor layer 122 may be electrically connected to each of the common source lines 180 through each of the common source regions 112.

Referring to FIGS. 3 and 5, a plurality of channel structures 150 may pass through the upper gate stack 135S and the lower gate stack 130S in the memory cell region MCR, and may extend from the main surface 110M of the substrate 110 in the vertical direction (Z direction). The plurality of channel structures 150 may be arranged spaced a predetermined distance apart from each other in the first horizontal direction (X direction), the second horizontal direction (Y direction), and a third horizontal direction (e.g., a diagonal direction). The plurality of channel structures 150 may be arranged in a zigzag form or a staggered form.

The plurality of channel structures 150 include a lower channel structure 150L and an upper channel structure 150U. The lower channel structure 150L is disposed in a lower channel hole 150HL penetrating the lower gate stack 130S and the first interlayer insulation layer 144. A gate insulation layer 152 and a channel layer 154 are sequentially disposed on an inner surface of the lower channel hole 150HL, and a buried insulation layer 156 is disposed on the channel layer 154 to fill a remaining space of the lower channel hole 150HL. A conductive plug 158 is disposed at a top portion of the lower channel hole 150HL and contacts the channel layer 154. In an exemplary embodiment, the conductive plug 158 blocks an entrance of the lower channel hole 150HL. Thus, the upper channel structure 150U may include the gate insulation layer 152, the channel layer 154, the buried insulation layer 156, and the conductive plug 158.

The upper channel structure 150U is disposed in an upper channel hole 150HU penetrating the upper gate stack 135S and the second interlayer insulation layer 146. The gate insulation layer 152 and the channel layer 154 are sequentially disposed on an inner sidewall of the upper channel hole 150HU, and the buried insulation layer 156 is disposed on the channel layer 154 to fill a remaining space of the upper channel hole 150HU. The conductive plug 158 is disposed at a top portion of the upper channel hole 150HU and contacts the channel layer 154. In an exemplary embodiment, the conductive plug 158 blocks an entrance of the upper channel hole 150HU. In an exemplary embodiment, the buried insulation layer 156 is omitted, and the channel layer 154 is formed in a pillar shape to fill the remainders of the lower and upper channel holes 150HL and 150HU. For example, the channel layer 154 may be enlarged to take up the volume occupied by the buried insulation layer 156 when the buried insulation layer 156 is omitted.

Referring to FIG. 8, the gate insulation layer 152 (e.g., 152L) includes a tunneling insulation layer 152A, a charge storage layer 152B, and a blocking insulation layer 152C that are sequentially disposed on a sidewall 154S of the channel layer 154. A thickness of each of the tunneling insulation layer 152A, the charge storage layer 152B, and the blocking insulation layer 152C are not be limited to that shown in FIG. 8, and may be variously changed.

The tunneling insulation layer 152A may include silicon oxide, hafnium oxide, aluminum oxide, zirconium oxide, and/or tantalum oxide. The charge storage layer 152B may store charges passing through the tunneling insulation layer 152A from the channel layer 154 and may include silicon nitride, boron nitride, silicon boron nitride, or doped polysilicon. The blocking insulation layer 152C may include silicon oxide, silicon nitride, and/or a metal oxide having a higher dielectric constant than silicon oxide. The metal oxide may include silicon oxide, hafnium oxide, aluminum oxide, zirconium oxide, tantalum oxide, or a combination thereof.

A gate insulation layer separation region 152SR may be formed at a lower portion of the lower channel hole 150HL. The sidewall 154S of the channel layer 154 may be at least partially surrounded by the first semiconductor layer 122 at the gate insulation layer separation region 152SR. For example, the first semiconductor layer 122 may contact a portion of the sidewall 154S. Here, a portion of the gate insulation layer 152 located at a higher level than the gate insulation layer separation region 152SR may be referred to as a lower gate insulation layer 152L, and a portion of the gate insulation layer 152 located at a lower level than the gate insulation layer separation region 152SR may be referred to as a floor gate insulation layer 152F. In an exemplary embodiment, the floor gate insulation layer 152F is spaced apart from the lower gate insulation layer 152L in the vertical direction (Z direction). The first semiconductor layer 122 may contact and at least partially surround the sidewall 154S of the channel layer 154 between the floor gate insulation layer 152F and the lower gate insulation layer 152L. For example, a portion of the first semiconductor layer 122 may be interposed between the floor gate insulation layer 152F and the lower gate insulation layer 152L to keep these layers spaced apart from one another.

In an exemplary embodiment, as shown in FIG. 8, the first semiconductor layer 122 includes a protrusion 122P protruding upward and downward in the vertical direction (Z direction) at a portion thereof contacting the lower gate insulation layer 152L and the floor gate insulation layer 152F. In an exemplary embodiment, a portion of the protrusion 122P of the first semiconductor layer 122 contacting the blocking insulation layer 152C protrudes further than a portion of the protrusion 122P of the first semiconductor layer 122 contacting the tunneling insulation layer 152A and the charge storage layer 152B, such that a protrusion step 122PS is formed at the protrusion 122P. However, the inventive concept is not limited thereto.

As shown in FIG. 3, a bit line contact BLC may penetrate the upper interlayer insulation layer 148 and may contact the conductive plug 158 of the upper channel structure 150U. In an embodiment, a bit line BL is disposed on the upper interlayer insulation layer 148 to contact the bit line contact BLC. The bit line BL may extend in the second horizontal direction (Y direction). When data is read from the memory cell array MCA, the data may be read from the bit line BL. When data is written to the memory cell array MCA, the data may be applied to the bit line BL to write the data to the memory cell array MCA.

In one block, the uppermost upper gate electrode 136 may be separated into two portions in a plan view by a string separating insulation layer 174. The string separating insulation layer 174 may extend from the same level as an upper surface of the second interlayer insulation layer 146 to a level lower than a lower surface of the uppermost upper gate electrode 136. In some embodiments, unlike that shown in FIG. 3, the string separating insulation layer 174 extends from the same level as the upper surface of the second interlayer insulation layer 146 to a level lower than a lower surface of a next uppermost upper gate electrode 136, such that each of two uppermost upper gate electrodes are separated into two portions in a plan view by the string separating insulation layer 174.

Referring to FIGS. 4, 5, 6, and 7, in the connection region CON, an insulating separation structure 160 is disposed on the substrate 110. The insulating separation structure 160 includes a first insulation layer 162 disposed on the substrate 110, a second insulation layer 164 disposed on the first insulation layer 162, and an etch stop layer 166 covering a sidewall of the first insulation layer 162 and a sidewall of the second insulation layer 164. The first insulation layer 162 and the etch stop layer 166 may include a material having an etch selectivity with respect to the second insulation layer 164. For example, the first insulation layer 162 and the etch stop layer 166 may include silicon oxide, and the second insulation layer 164 may include silicon nitride.

In an embodiment, the etch stop layer 166 includes a first portion 166P1 vertically overlapped with the word line cut region WLC (e.g., the common source line 180) and extending in the first horizontal direction (X direction) and a second portion 166P2 extending in the second horizontal direction (Y direction) in an edge of the connection region CON. As shown in FIG. 7, the second portion 166P2 of the etch stop layer 166 has a first sidewall 166S1 and a second sidewall 166S2 opposite to the first sidewall 166S1. In an embodiment, the first sidewall 166S1 of the second portion 166P2 of the etch stop layer 166 contacts the sidewalls of the first and second insulation layers 162 and 164, and the second sidewall 166S2 of the second portion 166P2 of the etch stop layer 166 contacts the first semiconductor layer 122. In an embodiment, an upper surface of the etch stop layer 166 is located at the same level as an upper surface of the second insulation layer 164. In an embodiment, a lower surface of the etch stop layer 166 is located at a level lower than the main surface 110M of the substrate 110.

In an embodiment, as shown in FIG. 4, the first portion 166P1 of the etch stop layer 166 has a width W21 in the second horizontal direction (Y direction) greater than a width W31 of the word line cut region WLC in the second horizontal direction (Y direction). Accordingly, the first portion 166P1 of the etch stop layer 166 may cover the bottom surface of the common source line 180 and bottom surfaces of the insulation spacers 182 on the sidewalls of the common source line 180. In an embodiment, the second insulation layer 164 is spaced apart from the common source line 180 due to the first portion 166P1 of the etch stop layer 166. A portion of the first portion 166P1 of the etch stop layer 166 may be interposed between the word line cut region WLC and the second insulation layer 164. In an embodiment, the second insulation layer 164 does not overlap with the word line cut region WLC (e.g., the common source line 180).

In an embodiment, the second insulation layer 164 is an unremoved portion of a sacrificial layer used to form the first semiconductor layer 122. In a manufacturing process according to an exemplary embodiment of the inventive concept, after the first insulation layer 162 and the second insulation layer 164 are formed on the substrate 110, portions of the first insulation layer 162, the second insulation layer 164, and the substrate 110 are removed, and then the etch stop layer 166 is formed in the etched region. For example, portions of the first insulation layer 162, the second insulation layer 164, and the substrate 110 may be removed to generate openings and then the etch stop layer 166 may be formed in these openings. The first insulation layer 162 and the second insulation layer 164 remaining in the memory cell region MCR may refer to a first sacrificial layer (see, e.g., 162P of FIG. 25A) and a second sacrificial layer (see, e.g., 164P of FIG. 25A), respectively. When the second sacrificial layer (see, e.g., 164P of FIG. 25A) is exposed through the word line cut region WLC in the memory cell region MCR, the etch stop layer 166 may be exposed in the connection region CON. Thus, only the second sacrificial layer (see, e.g., 164P of FIG. 25A) in the memory cell region MCR is selectively removed, and then the first sacrificial layer (see, e.g., 162P of FIG. 25A) in the memory cell region MCR is removed to form the first semiconductor layer 122 between the substrate 110 and the second semiconductor layer 124 in the memory cell region MCR. However, in an exemplary embodiment, the first insulation layer 162 and the second insulation layer 164 are left unremoved between the substrate 110 and the second semiconductor layer 124 in the connection region CON.

The lower gate stack 130S and the upper gate stack 135S may extend in the connection region CON to form a pad part PAD. The second semiconductor layer 124 may be disposed on the insulating separation structure 160. The pad part PAD may be disposed on the second semiconductor layer 124. As shown in FIG. 5, in the connection region CON, the plurality of lower gate electrodes 132 and the plurality of upper gate electrodes 136 may extend to have shorter lengths in the first horizontal direction (X direction) as a distance from the main surface 110M of the substrate 110 increases. For example, a width of a lower gate electrode 132 at a first height may be less than the width of a lower gate electrode 132 at a second height when the first height is greater than the second height. For example, a width of an upper gate electrode 136 at a third height may be less than the width of an upper gate electrodes 136 at a fourth height when the third height is greater than the fourth height. The pad part PAD may refer to portions of the lower gate electrodes 132 and the upper gate electrodes 136 that are disposed in a step form. A lower cover insulation layer 142L may be disposed on the portion of the lower gate stack 130S constituting the pad part PAD. An upper cover insulation layer 142U may be disposed on the portion of the upper gate stack 135S constituting the pad part PAD. As shown in FIG. 2, a pad contact 172 may be disposed in the connection region CON to be connected to each of the lower gate electrodes 132 or each of the upper gate electrodes 136.

Referring to FIGS. 4 and 5, in the connection region CON, a plurality of dummy channel structures D150 penetrate the upper gate stack 135S and the lower gate stack 130S and may extend from the main surface 110M of the substrate 110 in the vertical direction (Z direction). Each of the plurality of dummy channel structures D150 may include a lower dummy channel structure D150L and an upper dummy channel structure D150U. The lower dummy channel structure D150L is disposed in a lower dummy channel hole D150HL penetrating the first interlayer insulation layer 144, the lower gate stack 130S, and the lower cover insulation layer 142L. The lower dummy channel structure D150L may extend from the main surface 110M of the substrate 110. The upper dummy channel structure D150U is disposed in an upper dummy channel hole D150HU penetrating the second interlayer insulation layer 146, the upper gate stack 135S, and the upper cover insulation layer 142U. The lower dummy channel structure D150L includes a dummy gate insulation layer D152, a dummy channel layer D154, and a dummy buried insulation layer D156 that are sequentially disposed on an inner surface of the lower dummy channel hole D150HL and may further include a dummy conductive plug D158 blocking an upper entrance of the lower dummy channel hole D150HL. The upper dummy channel structure D150U includes the dummy gate insulation layer D152, the dummy channel layer D154, and the dummy buried insulation layer D156 that are sequentially disposed on an inner sidewall of the upper dummy channel hole D150HU and may further include the dummy conductive plug D158 blocking an upper entrance of the upper dummy channel hole D150HU. The dummy channel structure D150 may be formed so that the semiconductor device 100 has structural stability during the manufacturing process of the semiconductor device 100.

In an embodiment, a lower portion of the dummy channel structure D150 is at least partially surrounded by the second semiconductor layer 124 and the insulating separation structure 160. For example, a lower portion of the lower dummy channel structure D150L may be at least partially surrounded by the second semiconductor layer 124 and the insulating separation structure 160. In an embodiment, a bottom of the dummy channel structure D150 is covered by the substrate 110. For example, a bottom of the lower dummy channel structure D150L may be covered by the substrate 110. Since the dummy gate insulation layer D152 is disposed on the outer surface of the lower dummy channel hole D150HL, an outer sidewall and a lower surface of the dummy channel layer D154 may be completely covered by the dummy gate insulation layer D152, and the dummy channel layer D154 does not contact the second semiconductor layer 124, the insulating separation structure 160, or the substrate 110. In addition, since the first semiconductor layer 122 and the insulating separation structure 160 are disposed on the substrate 110 in the memory cell region MCR and the connection region CON, respectively, the dummy channel structure D150 is not vertically overlapped with the first semiconductor layer 122. That is, the dummy channel structure D150 in the connection region CON may be disposed spaced apart from the first semiconductor layer 122.

A cell dummy channel structure D150C may be selectively disposed in an edge portion of the memory cell region MCR. As shown in FIG. 7, a lower portion of the cell dummy channel structure D150C may be at least partially surrounded by the first semiconductor layer 122. In an embodiment, the dummy gate insulation layer D152 is not formed in a portion of the cell dummy channel structure D150C that is at least partially surrounded by the first semiconductor layer 122. In an embodiment, the dummy channel layer D154 of the cell dummy channel structure D150C contacts the first semiconductor layer 122.

Referring to FIG. 7, at a first vertical level LV1 (see FIG. 5 or FIG. 6), the dummy gate insulation layer D152 of the lower dummy channel structure D150L may be at least partially surrounded by the second insulation layer 164 and may have a sidewall D152S contacting the second insulation layer 164. On the other hand, as shown in FIG. 5, at the first vertical level LV1, the gate insulation layer 152 is not disposed on the channel layer 154 of the lower channel structure 150L, and as shown in FIG. 7, a sidewall 154S of the channel layer 154 contacts the first semiconductor layer 122. In an exemplary embodiment, at the first vertical level LV1, the lower channel structure 150L has a first width W11 in the first horizontal direction (X direction), and the lower dummy channel structure D150L has a second width W12 greater than the first width W11 in the first horizontal direction (X direction). In an exemplary embodiment, the cell dummy channel structure D150C has a third width W13 greater than the first width W11 and less than the second width W12 in the first horizontal direction (X direction).

In the memory cell region MCR, since the channel layer 154 exposed at the lower portion of the channel structure 150 contacts the first semiconductor layer 122, the channel layer 154 is electrically connected to the common source line 180. In the connection region CON, since the lower portion of the dummy channel structure D150 contacts the insulating separation structure 160, the dummy channel layer D154 of the dummy channel structure D150 is electrically insulated from the common source line 180.

In a semiconductor device according to a comparative example, in the connection region CON, the first semiconductor layer 122 is formed on a lower portion of the dummy channel structure D150, and the dummy channel layer D154 of the dummy channel structure D150 and the channel layer 154 of the channel structure 150 are connected in common to the common source line 180 via the first semiconductor layer 122. In this case, due to a defect or a failure occurring in the dummy channel layer D154 or the dummy gate insulation layer D152 in the manufacturing process of the dummy channel structure D150, a defect or failure may occur in the channel structure 150 electrically connected to the dummy channel structure D150 through the common source line 180.

In the semiconductor device 100 according to an exemplary embodiment of the inventive concept, the insulating separation structure 160 is disposed below the dummy channel structure D150 (e.g., D150L), and the dummy channel layer D154 of the dummy channel structure D150 is not electrically connected to the common source line 180. Accordingly, even though a defect or failure occurs in the dummy channel layer D154 or the dummy gate insulation layer D152 in the manufacturing process of the dummy channel structure D150, the channel structure 150 in the memory cell region MCR may normally operate, and thus the semiconductor device 100 may have improved reliability.

Figure 10:
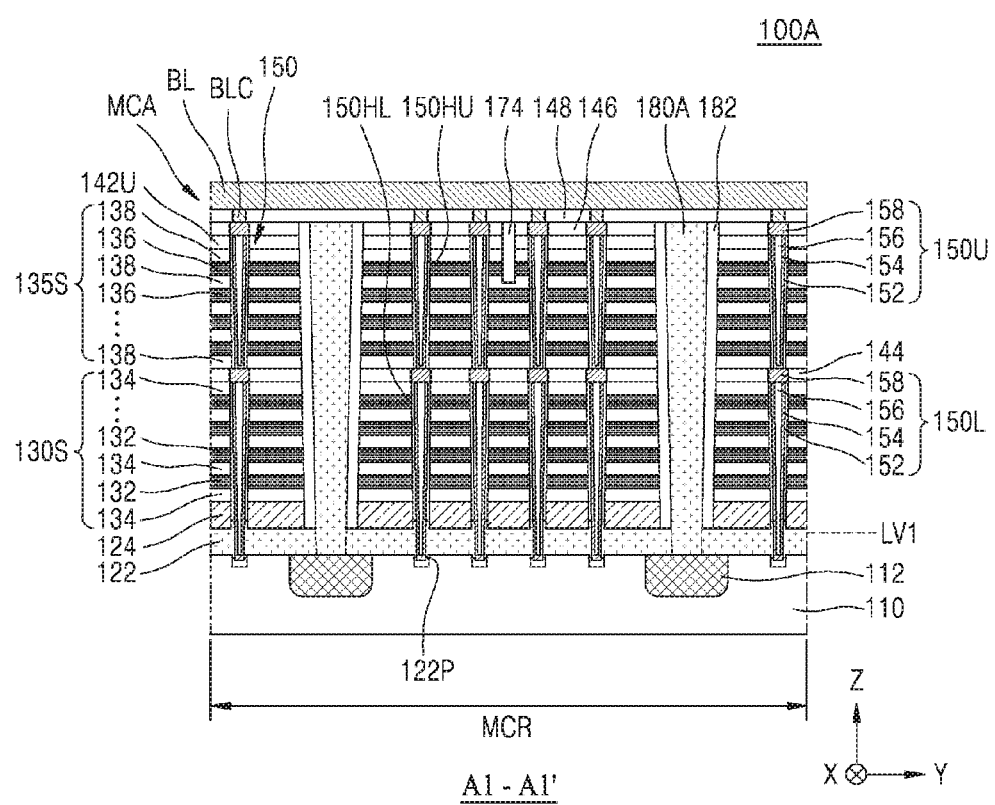
FIGS. 10 and 11 are cross-sectional views illustrating a semiconductor device according to exemplary embodiments of the inventive concept.
Figure 11:
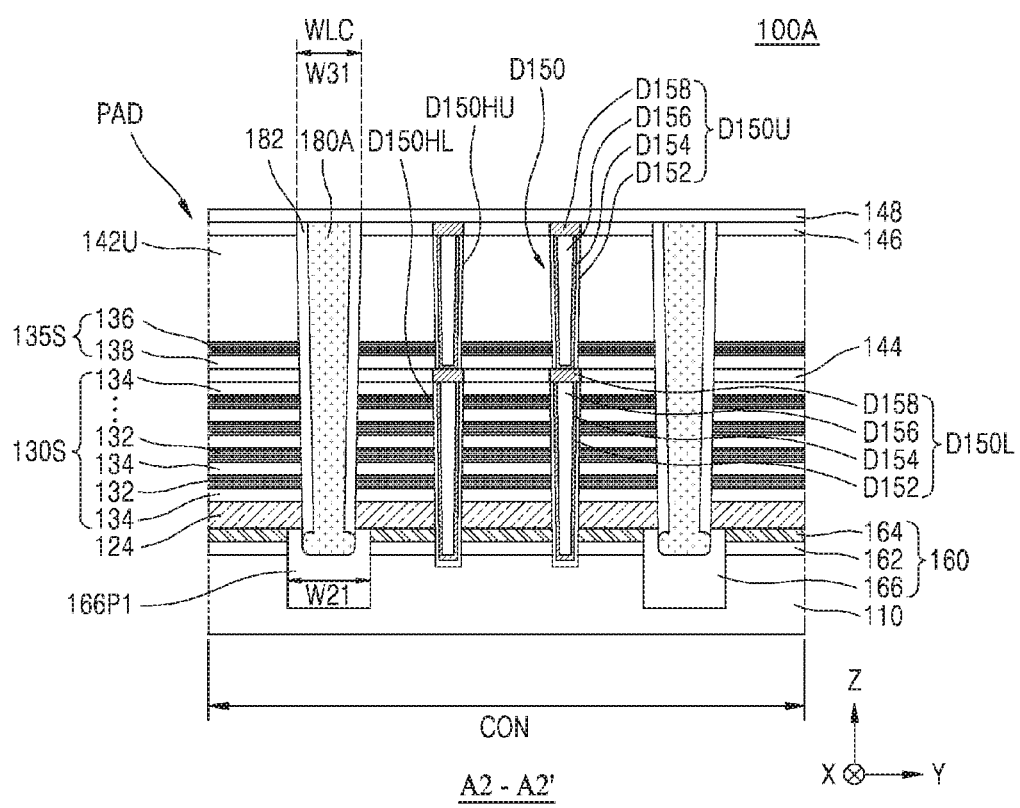
Figure 12:
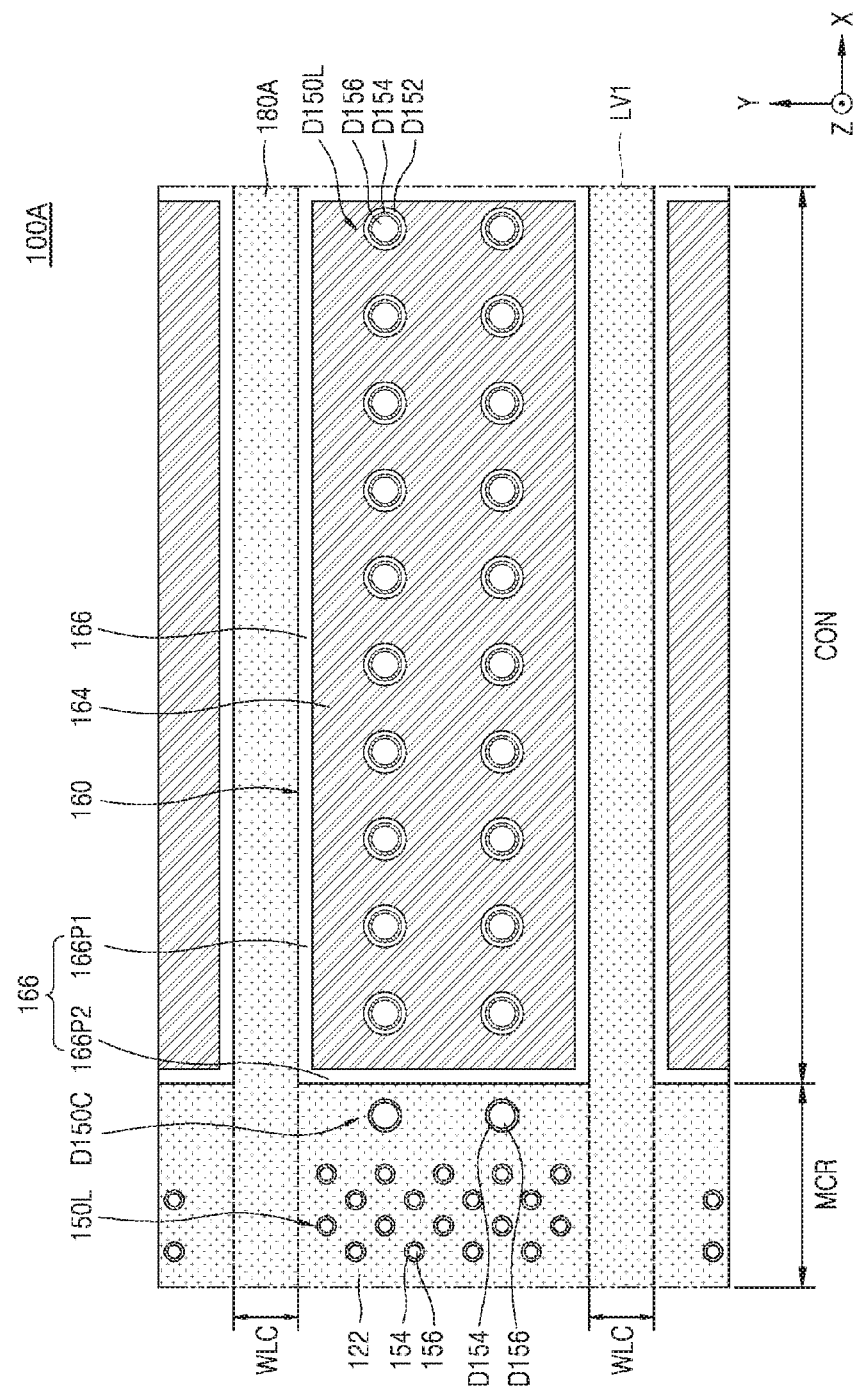
FIG. 12 is a horizontal cross-sectional view at a first vertical level LV1 of FIG. 10.

FIGS. 10 and 11 are cross-sectional views illustrating a semiconductor device 100A according to an exemplary embodiment of the inventive concept. FIG. 12 is a horizontal cross-sectional view at a first vertical level LV1 of FIG. 10. FIG. 10 corresponds to a cross-sectional view taken along line A1-A1' of FIG. 2. FIG. 11 corresponds to a cross-sectional view taken along line A2-A2' of FIG. 2. In FIGS. 10 to 12, the same reference numerals are used to denote the same elements as shown in FIGS. 1 to 9.

Referring to FIGS. 10 to 12, in a semiconductor device 100A according to an exemplary embodiment of the inventive concept, a common source line 180A is connected to the first semiconductor layer 122. The common source line 180A may include doped polysilicon and may be formed along with the first semiconductor layer 122 at the same time in the process of forming the first semiconductor layer 122. As shown in FIG. 11, a first portion 166P1 of the etch stop layer 166 may cover a bottom portion of the common source line 180A. The common source line 180A may be spaced apart from the second insulation layer 164 in the second horizontal direction (Y direction) due to the first portion 166P1 of the etch stop layer 166. For example, the first portion 166P1 may be interposed between the common source line 180A and the etch stop layer 166 to prevent the common source line 180 from contacting the etch stop layer 166.

FIGS. 13 to 23 are schematic views illustrating a semiconductor device according to an exemplary embodiment of the inventive concept. Specifically, FIGS. 13, 14, 15, 16, 20, and 22 respectively correspond to the cross-sectional view taken along line A3-A3' of FIG. 2. FIGS. 17, 18, 19, 21, and 23 are horizontal cross-sectional views at the first vertical level LV1 of the corresponding drawings. In FIGS. 13 to 23, the same reference numerals are used to denote the same elements as shown in FIGS. 1 to 11.

Figure 13:
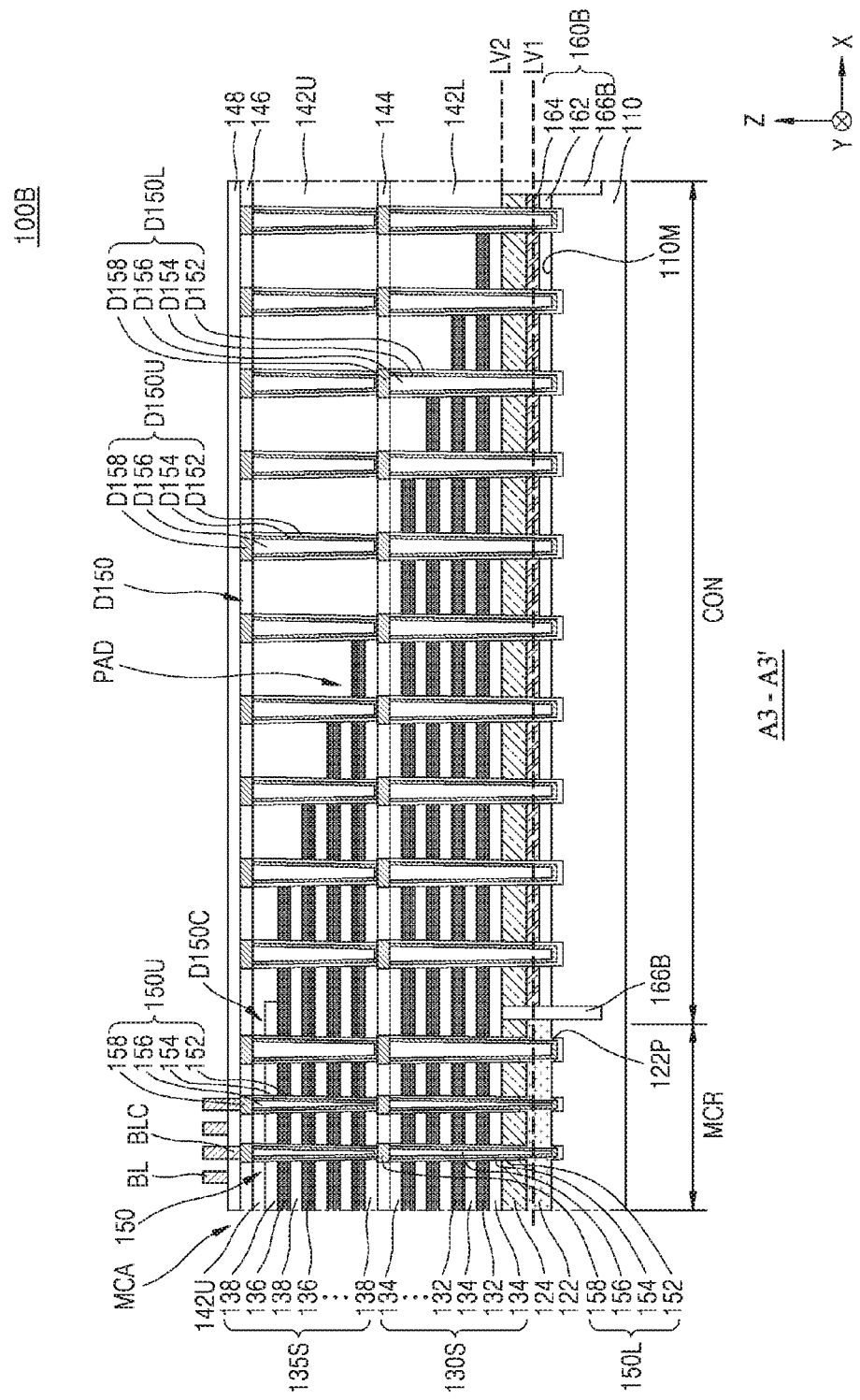
FIGS. 13 to 23 are schematic views illustrating a semiconductor device according to exemplary embodiments of the inventive concept.

Referring to FIG. 13, a semiconductor device 100B according to an exemplary embodiment of the inventive concept includes an insulating separation structure 160B having an upper surface located at the same level LV2 as an upper surface of the second semiconductor layer 124. For example, an etch stop layer 166B may have an upper surface coplanar with the upper surface of the second semiconductor layer 124 and may have a lower surface located at a lower level than the main surface 110M of the substrate 110. In a manufacturing process according to an exemplary embodiment of the inventive concept, after the first insulation layer 162, the second insulation layer 164, and the second semiconductor layer 124 are sequentially formed on the substrate 110, portions of the first insulation layer 162, the second insulation layer 164, the second semiconductor layer 124, and the substrate 110 are removed to form removed regions, and then the etch stop layer 166B is formed to fill the removed regions.

Figure 14:
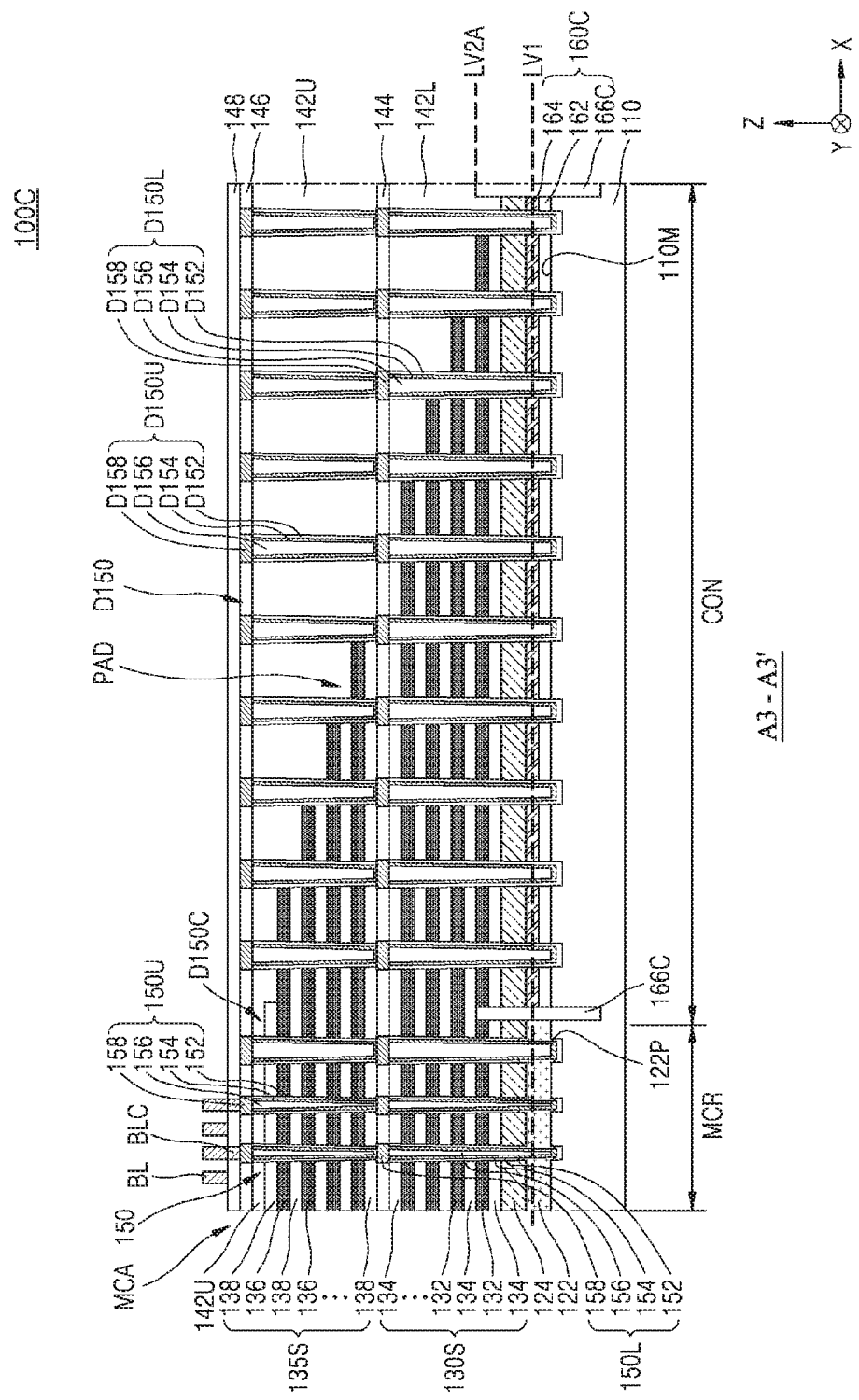

Referring to FIG. 14, a semiconductor device 100C according to an exemplary embodiment of the inventive concept includes an insulating separation structure 160C having an upper surface located at the same level LV2A as an upper surface of the lowermost lower gate electrode 132. For example, an etch stop layer 166C may have an upper surface located at the same level LV2A as the upper surface of the lowermost lower gate electrode 132 and may have a lower surface located at a level lower than the main surface 110M of the substrate 110. In a manufacturing process according to an exemplary embodiment of the inventive concept, after the first insulation layer 162, the second insulation layer 164, the second semiconductor layer 124, the lower insulation layer 134, and the lower sacrificial layer (see, e.g., 312 of FIG. 26) are sequentially formed on the substrate 110, portions of the first insulation layer 162, the second insulation layer 164, the second semiconductor layer 124, the lower insulation layer 134, the lower sacrificial layer (see, e.g., 312 of FIG. 26), and the substrate 110 are removed to form removed regions, and then the etch stop layer 166C is formed to fill the removed regions.

Figure 15:
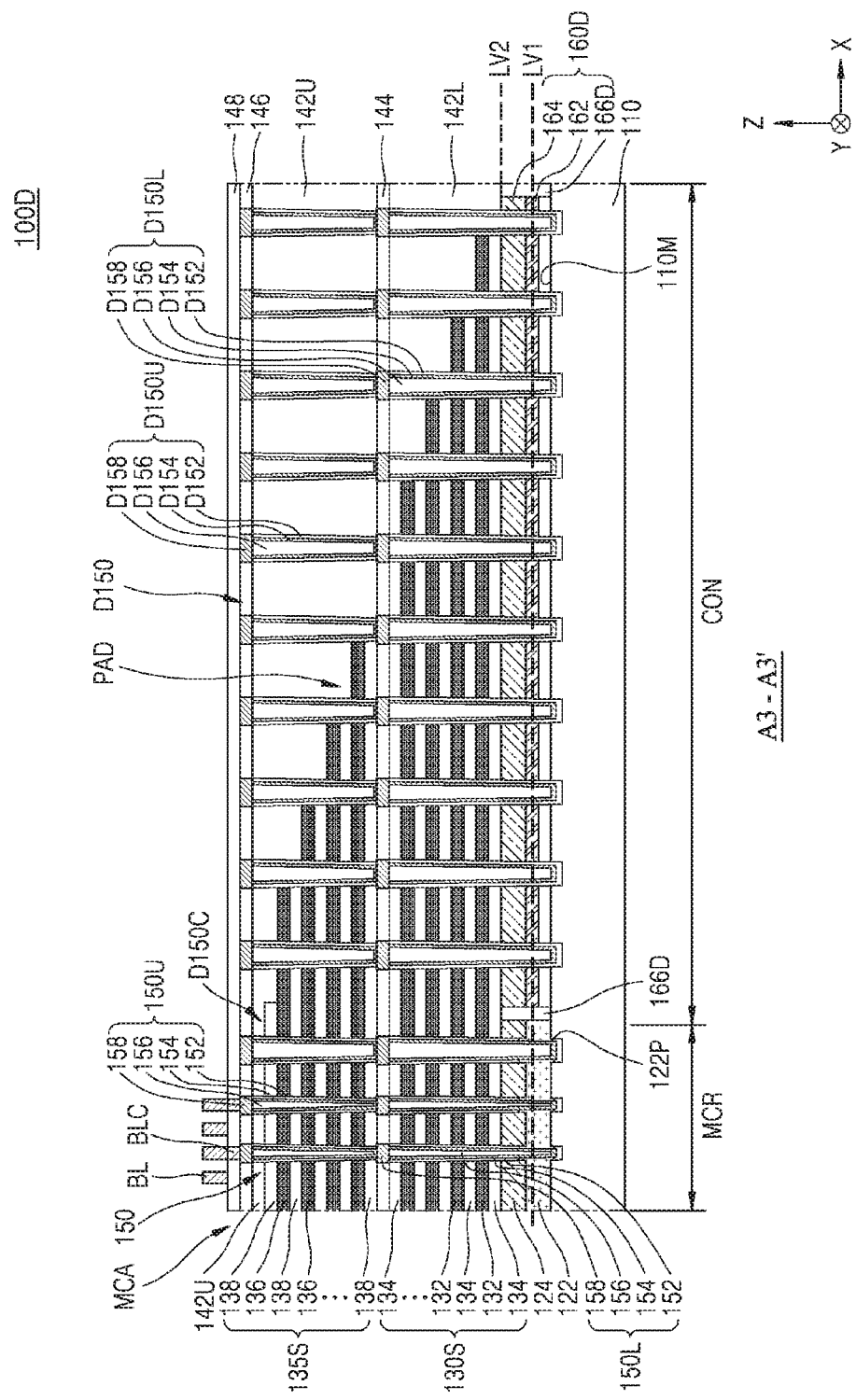

Referring to FIG. 15, a semiconductor device 100D according to an exemplary embodiment of the inventive concept includes an insulating separation structure 160D having a lower surface coplanar with the main surface 110M of the substrate 110. For example, an etch stop layer 166D may have an upper surface located at the same level LV2 as the upper surface of the second semiconductor layer 124 and may have a lower surface coplanar with the main surface 110M of the substrate 110. In a manufacturing process according to an exemplary embodiment of the inventive concept, after the first insulation layer 162, the second insulation layer 164, and the second semiconductor layer 124 are sequentially formed on the substrate 110, portions of the first insulation layer 162, the second insulation layer 164, the second semiconductor layer 124, and the substrate 110 are removed to form removed regions, and then the etch stop layer 166D is formed to fill the removed regions.

Figure 16:
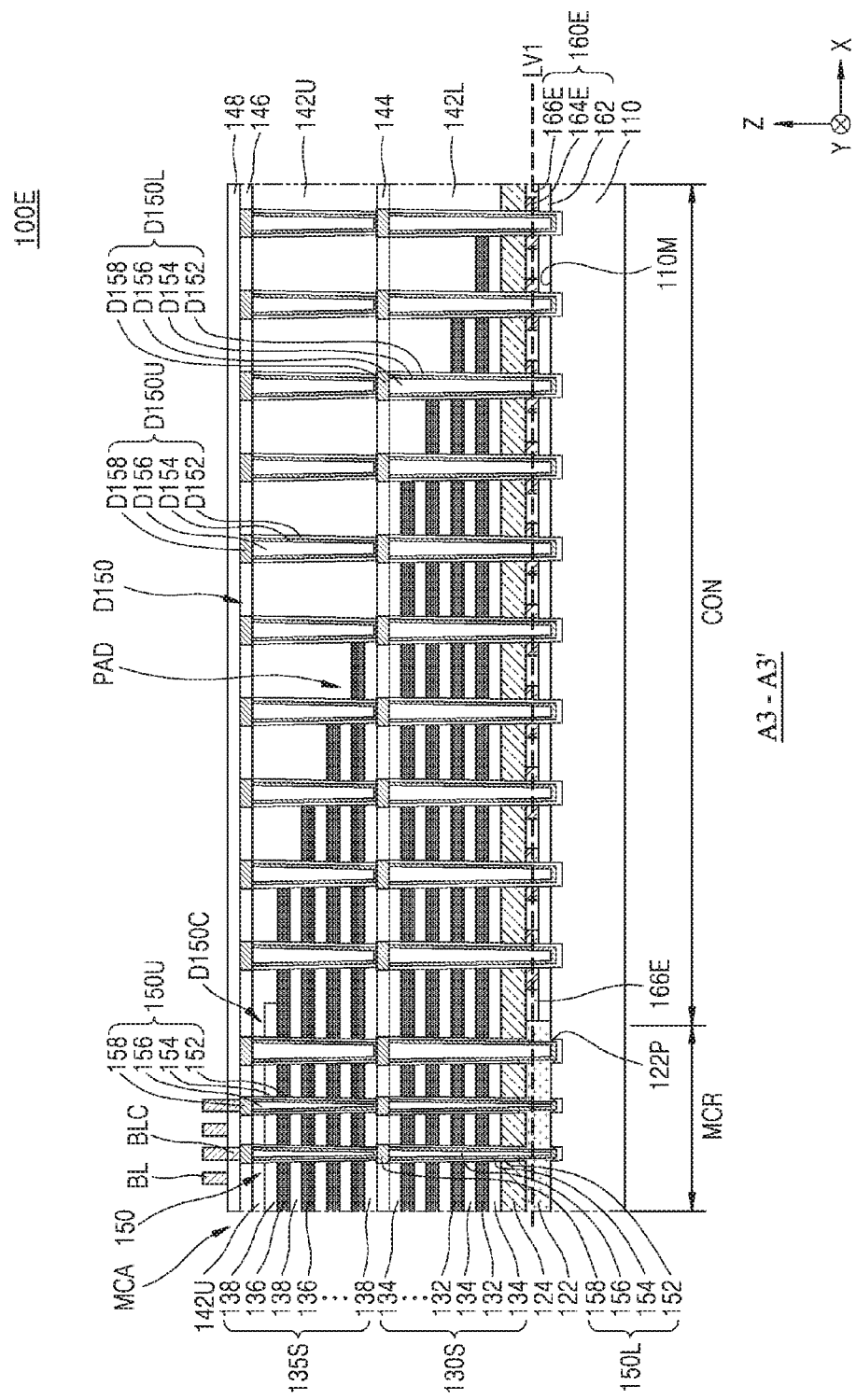
Figure 17:
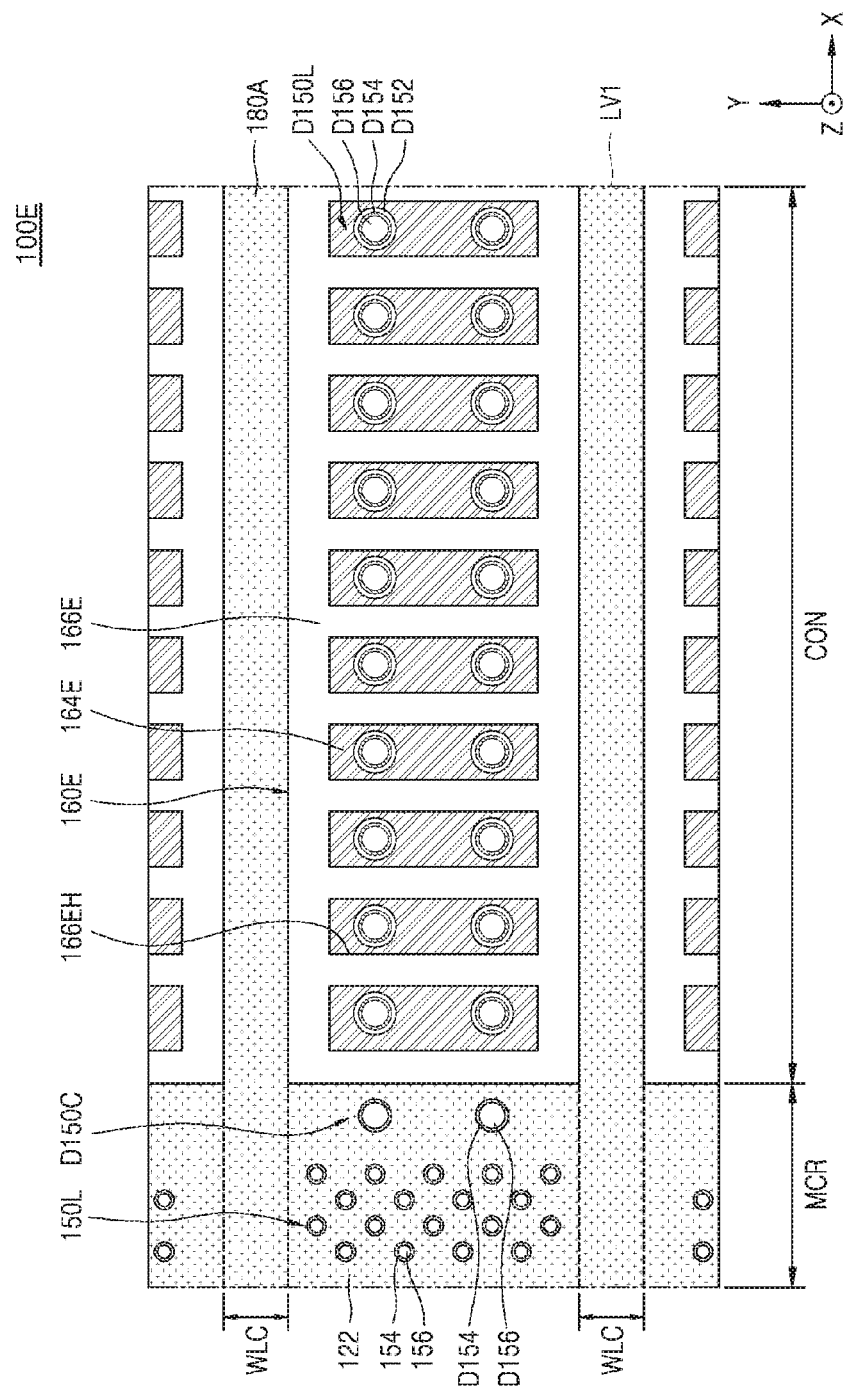

Referring to FIGS. 16 and 17, a semiconductor device 100E according to an exemplary embodiment of the inventive concept includes an insulating separation structure 160E including an etch stop layer 166E including a plurality of openings 166EH therein. In an embodiment, a second insulation layer 164E is disposed in each of the plurality of openings 166EH. Two dummy channel structures D150 (e.g., D150L) adjacent in the second horizontal direction (Y direction) may be disposed in each of the plurality of openings 166EH.

Figure 18:
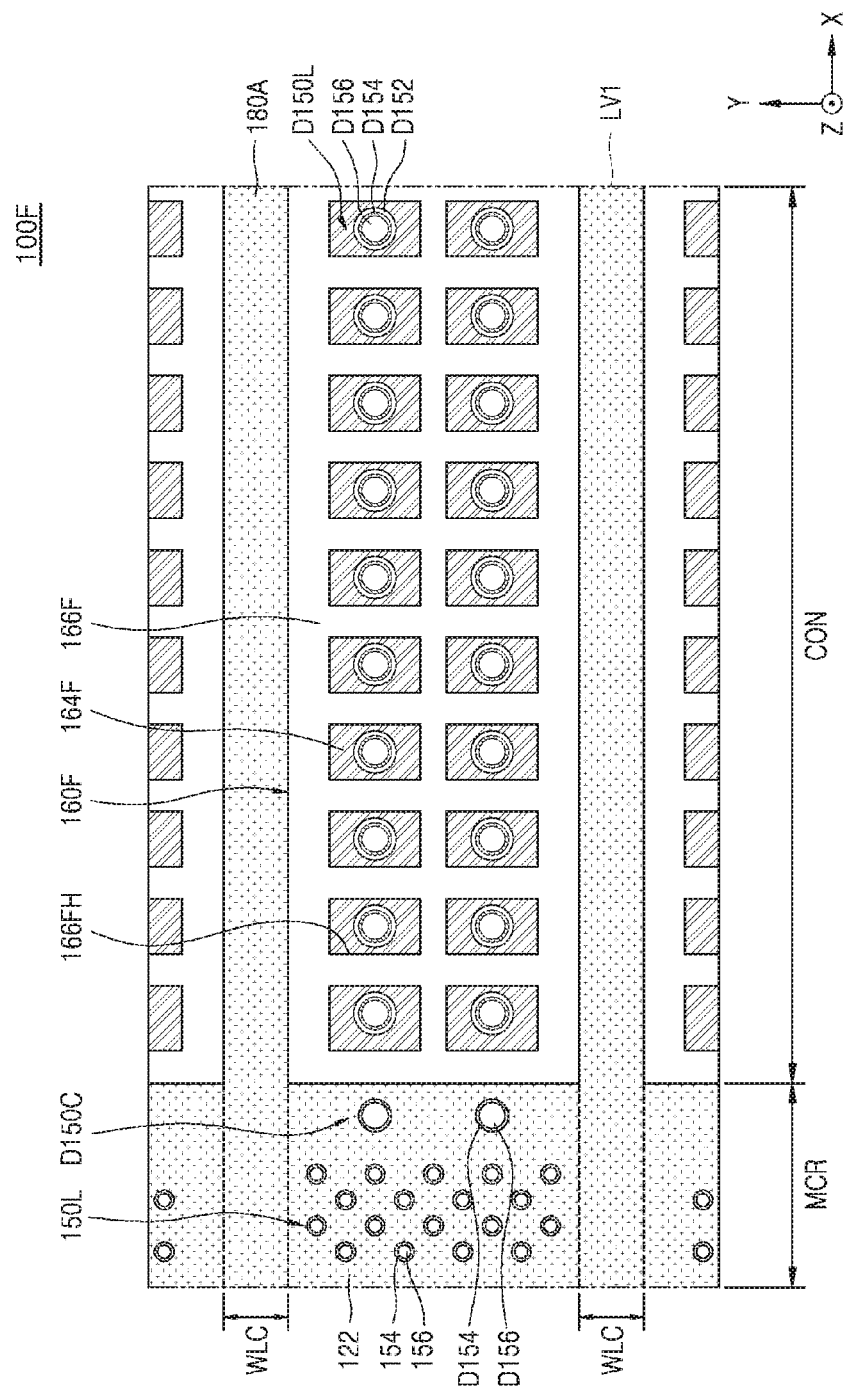

Referring to FIG. 18, a semiconductor device 100F according to an exemplary embodiment of the inventive concept includes an insulating separation structure 160F including an etch stop layer 166F including a plurality of openings 166FH therein. One dummy channel structure D150 (e.g., D150L) may be disposed in each of the plurality of openings 166FH. A second insulation layer 164F may be disposed in each of the plurality of openings 166FH and may at least partially surround the one dummy channel structure D150.

Figure 19:
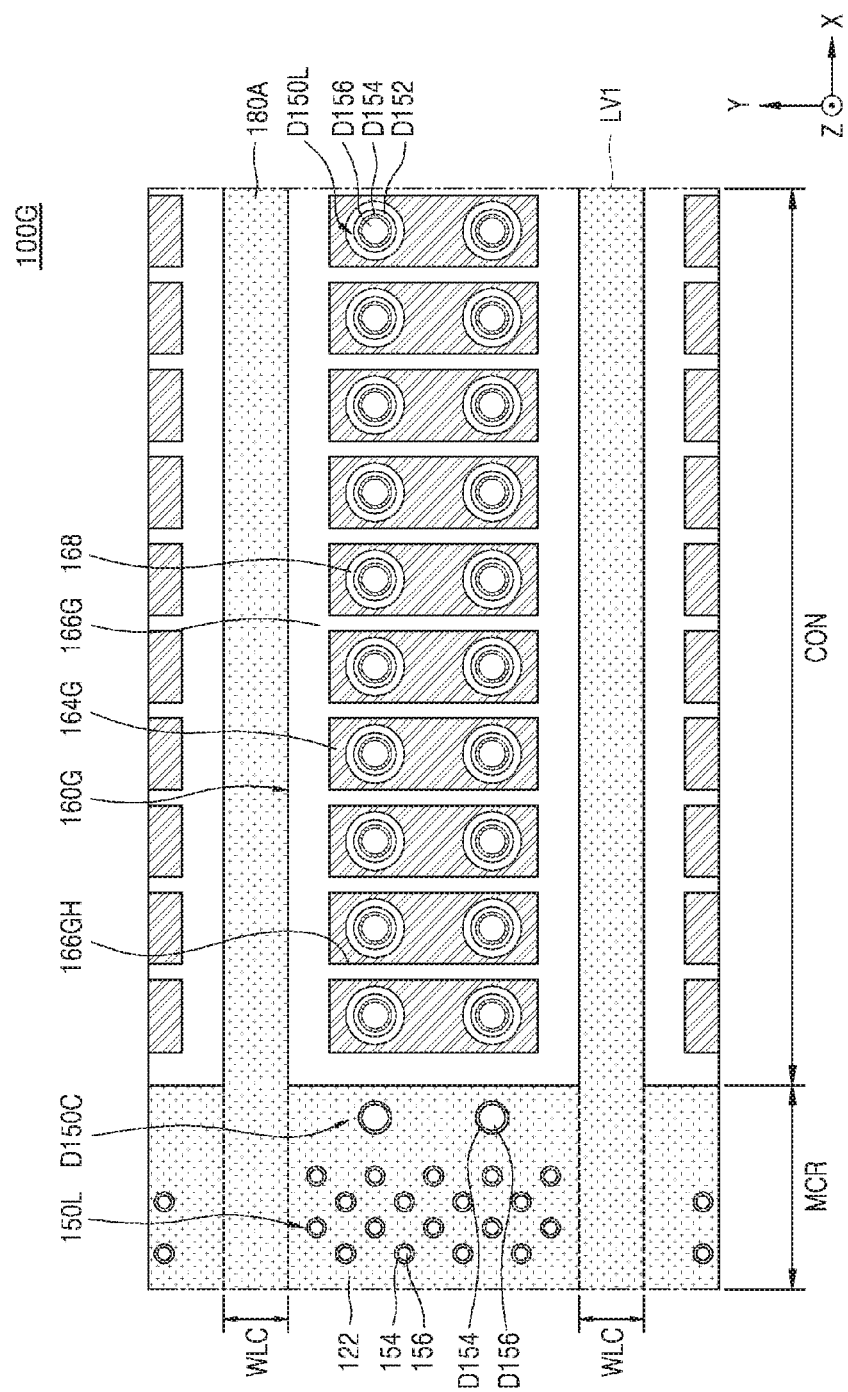

Referring to FIG. 19, a semiconductor device 100G according to an exemplary embodiment of the inventive concept includes an insulating separation structure 160G including an etch stop layer 166G including a plurality of openings 166GH therein. Two dummy channel structures D150 (e.g., D150L) adjacent in the second horizontal direction (Y direction) may be disposed in each of the plurality of openings 166GH. An intermediate insulation layer 168 may be further disposed between a second insulation layer 164G and the dummy channel structure D150 (e.g., D150L), in each of plurality of openings 166GH. The intermediate insulation layer 168 may include silicon oxide.

Figure 20:
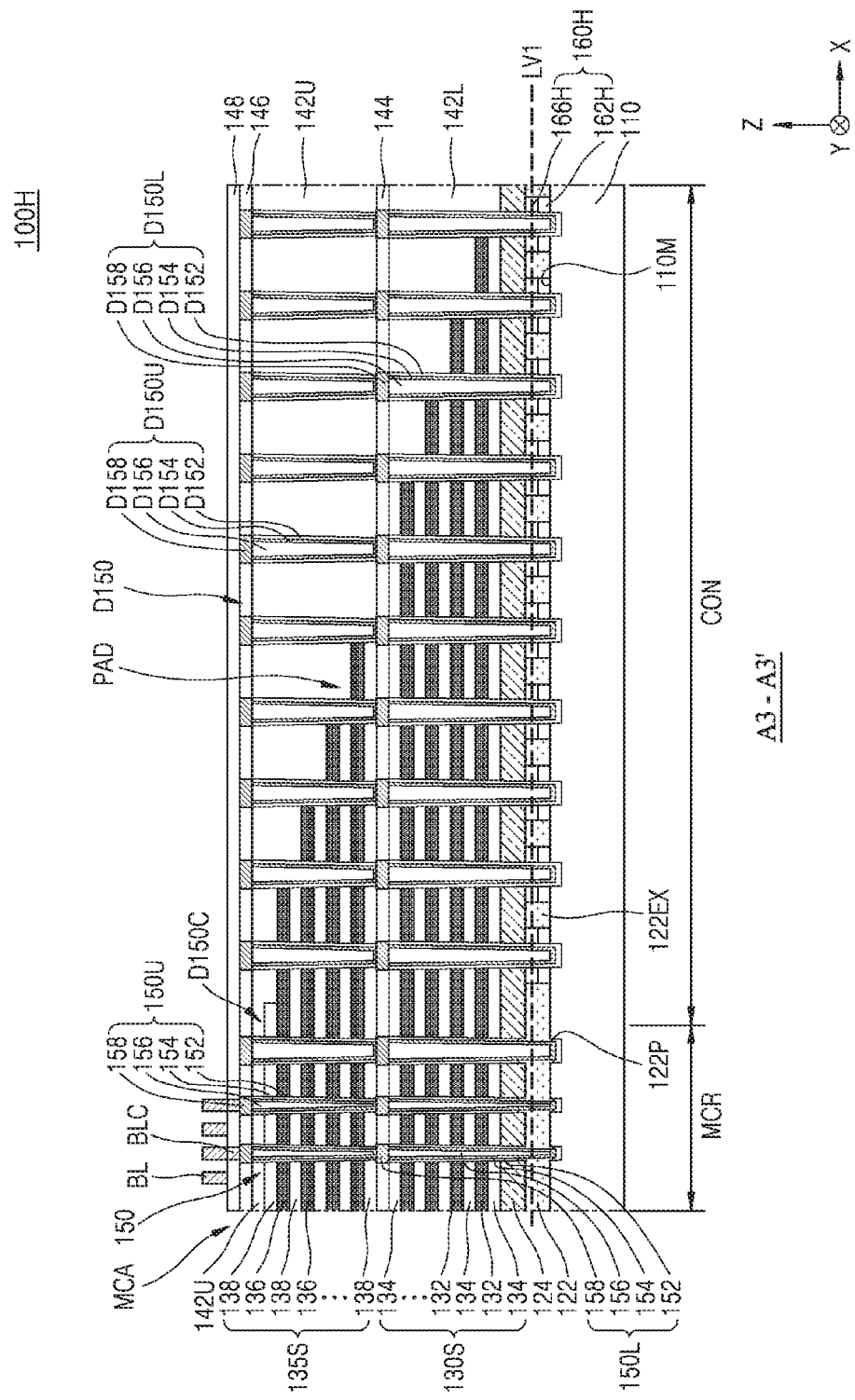
Figure 21:
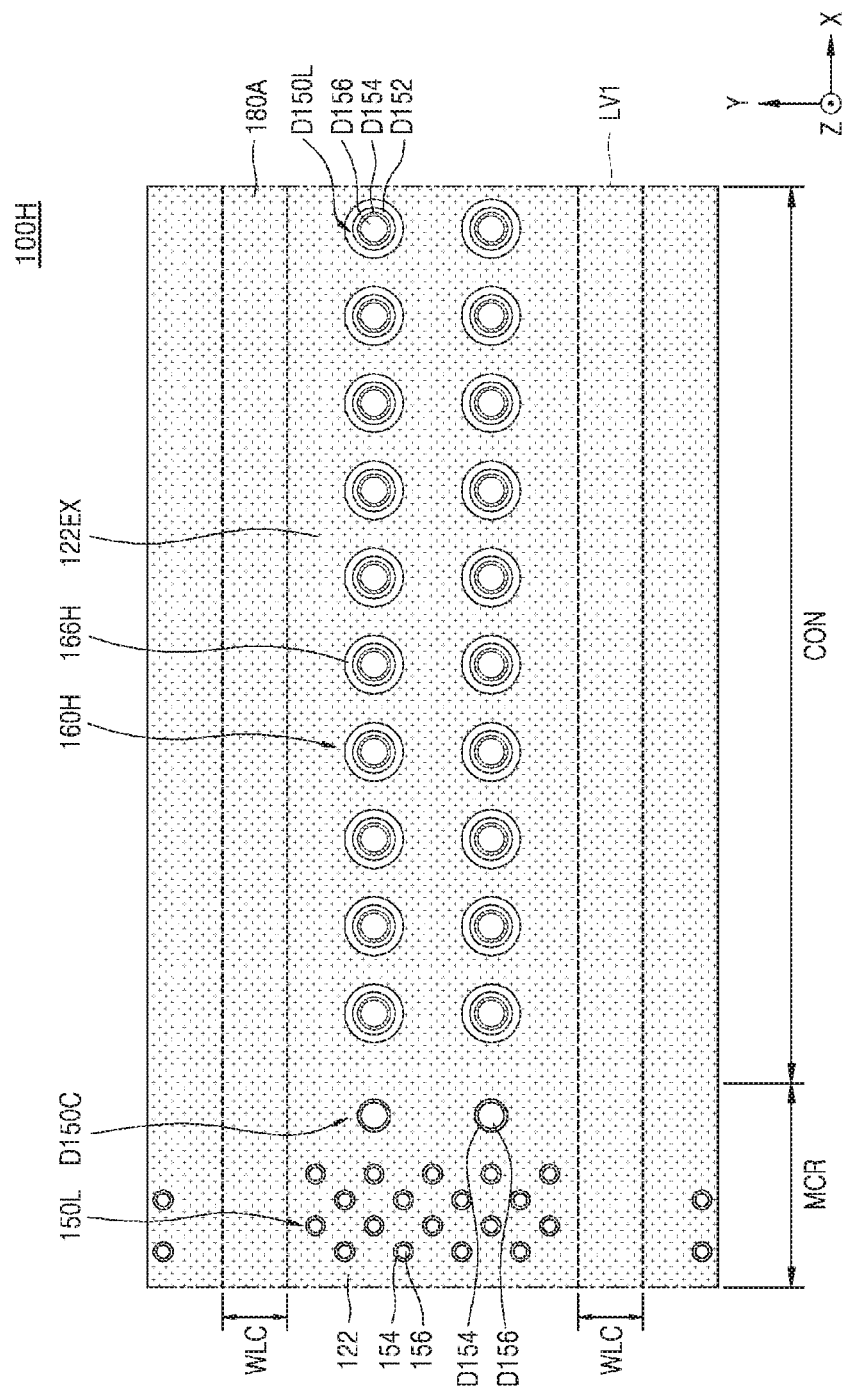

Referring to FIGS. 20 and 21, a semiconductor device 100H according to an exemplary embodiment of the inventive concept includes an insulating separation structure 160H including a plurality of first insulation layers 162H and a plurality of etch stop layers 166H. The plurality of etch stop layers 166H may be disposed on the respective ones of the plurality of the first insulation layers 162H. In an exemplary embodiment, each of the plurality of etch stop layers 166H and each of the plurality of first insulation layers 162H are disposed to at least partially surround a sidewall of one dummy channel structure D150 (e.g., D150L). In the connection region CON, in an exemplary embodiment, a third semiconductor layer 122EX is further disposed between the substrate 110 and the second semiconductor layer 124. The third semiconductor layer 122EX may at least partially surround the plurality of etch stop layers 166H and the plurality of first insulation layers 162H. Thus, the third semiconductor layer 122EX may be spaced apart from the dummy channel structure D150. For example, an etch stop layer 166H and a first insulation layer 162H may be interposed between a portion of the third semiconductor layer 122EX and a lower dummy channel structure D150L to prevent the portion of the third semiconductor layer 122EX from contacting the lower dummy channel structure D150L. The third semiconductor layer 122EX may include doped polysilicon and may be formed along with the first semiconductor layer 122 and the common source line 180A at the same time, but the inventive concept is not limited thereto.

Figure 22:
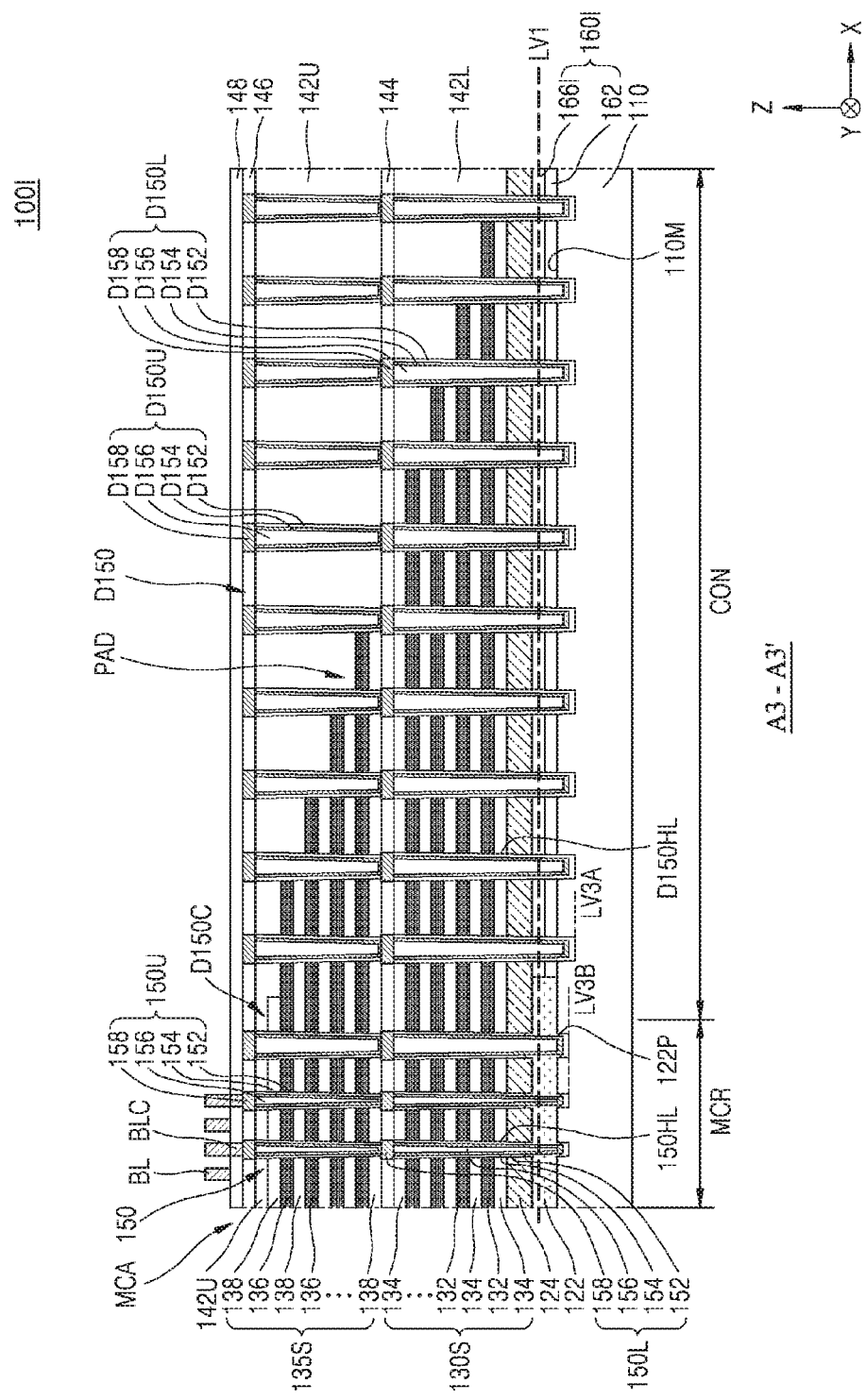
Figure 23:
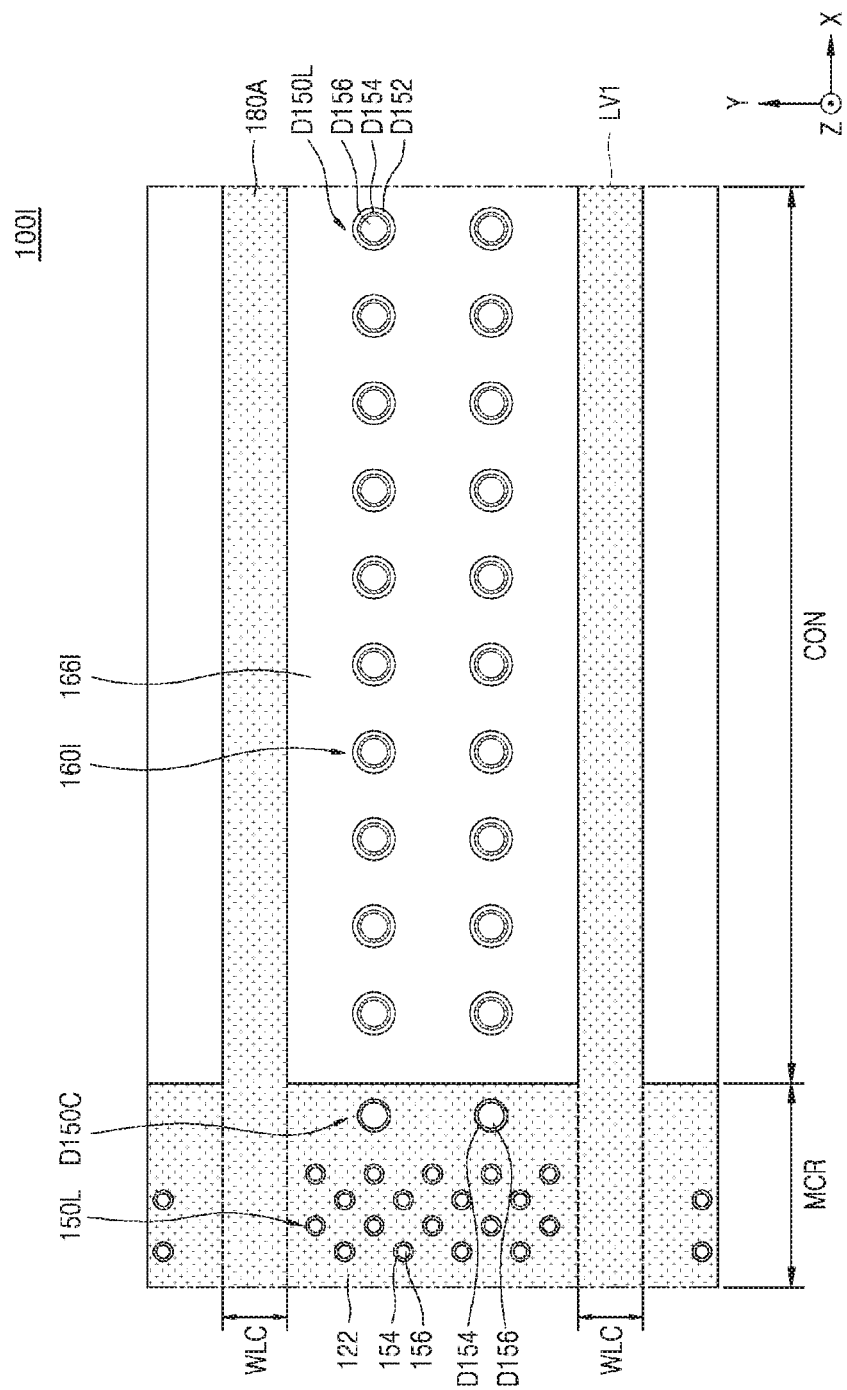

Referring to FIGS. 22 and 23, a semiconductor device 100I according to an exemplary embodiment of the inventive concept includes an insulating separation structure 160I including the first insulation layer 162 and an etch stop layer 166I. The etch stop layer 166I may be disposed on the first insulation layer 162. In an exemplary embodiment, a lower surface level LV3A of the dummy channel structure D150 (e.g., D150L) in the connection region CON is lower than a lower surface level LV3B of the channel structure 150 (e.g., 150L) in the memory cell region MCR. For example, in the process of forming the lower channel hole 150HL and the lower dummy channel hole D150H, a level difference between a bottom surface of the lower channel hole 150HL and a bottom surface of the lower dummy channel hole D150HL may occur due to a difference between an etch rate of the etch stop layer 166I in the connection region CON and an etch rate of the second sacrificial layer 164P in the memory cell region, In an exemplary embodiment, unlike that shown in FIG. 22, the lower surface level LV3A of the dummy channel structure D150 (e.g., D150L) in the connection region CON is equal to or higher than the lower surface level LV3B of the channel structure 150 (e.g., 150L) in the memory cell region MCR.

Figure 24:
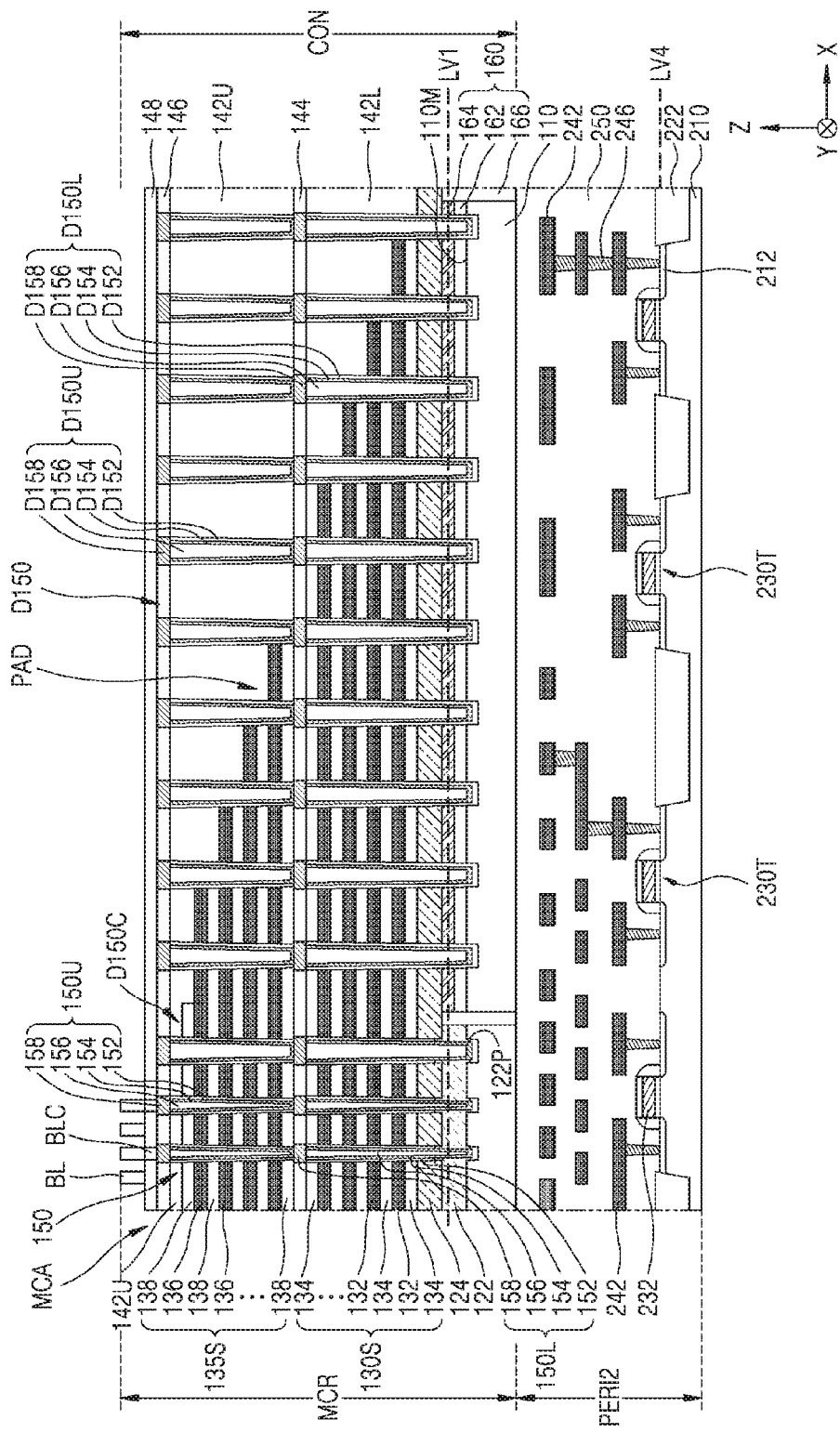
FIG. 24 is a cross-sectional view illustrating a semiconductor device according to an exemplary embodiment of the inventive concept.

FIG. 24 is a cross-sectional view illustrating a semiconductor device according to an exemplary embodiment of the inventive concept. In FIG. 24, the same reference numerals are used to denote the same elements as shown in FIGS. 1 to 23.

Referring to FIG. 24, in a semiconductor device 200 according to an exemplary embodiment of the inventive concept, a peripheral circuit region PERI2 is located at a lower vertical level than (or located below) the memory cell region MCR and the connection region CON. A lower substrate 210 is located at a lower vertical level than the substrate 110. An upper surface level LV4 of the lower substrate 210 is lower than an upper surface level of the substrate 110. An active region may be defined in the lower substrate 210 by an isolation layer 222. A plurality of driving transistors 230T are disposed on the active region. In an exemplary embodiment, each of the plurality of driving transistors 230T includes a driving circuit gate structure 232 and impurity regions 212 in the active region of the lower substrate 210 at opposite sides of the driving circuit gate structure 232.

A plurality of wiring lines 242, a plurality of contact plugs 246, and a lower interlayer insulation layer 250 may be disposed on the lower substrate 210. The plurality of contact plugs 246 may connect between the plurality of wiring lines 242 and between the plurality of wiring lines 242 and the plurality of driving transistors 230T. In an exemplary embodiment, the lower interlayer insulation layer 250 covers the plurality of wiring lines 242 and the plurality of contact plugs 246.

The substrate 110 is disposed on the lower interlayer insulation layer 250. The insulating separation structure 160 may separate the substrate 110 of the memory cell region MCR and the substrate 110 of the connection region CON. For example, a lower surface of the etch stop layer 166 may be coplanar with a lower surface of the substrate 110 and may contact an upper surface of the lower interlayer insulation layer 250.

FIGS. 25A to 37B are schematic views illustrating stages in a method of manufacturing a semiconductor device according to an exemplary embodiment of the inventive concept. Specifically, FIGS. 25A, 26, 27, 28A, 29, 31B, 35A, and 37B are cross-sectional views corresponding to the cross-sectional view taken along line A3-A3' of FIG. 2. FIGS. 30, 31A, 36, and 37A are cross-sectional views corresponding to the cross-sectional view taken along line A1-A1' of FIG. 2. FIGS. 25B, 28B, 31C, and 35B are horizontal cross-sectional views at a first vertical level LV1 of the corresponding drawings. FIGS. 31D, 32, 33, 34, and 35C are cross-sectional views corresponding to portion CX1 of FIG. 31B. In FIGS. 25A to 37B, the same reference numerals are used to denote the same elements as shown in FIGS. 1 to 24.

Figure 25A:
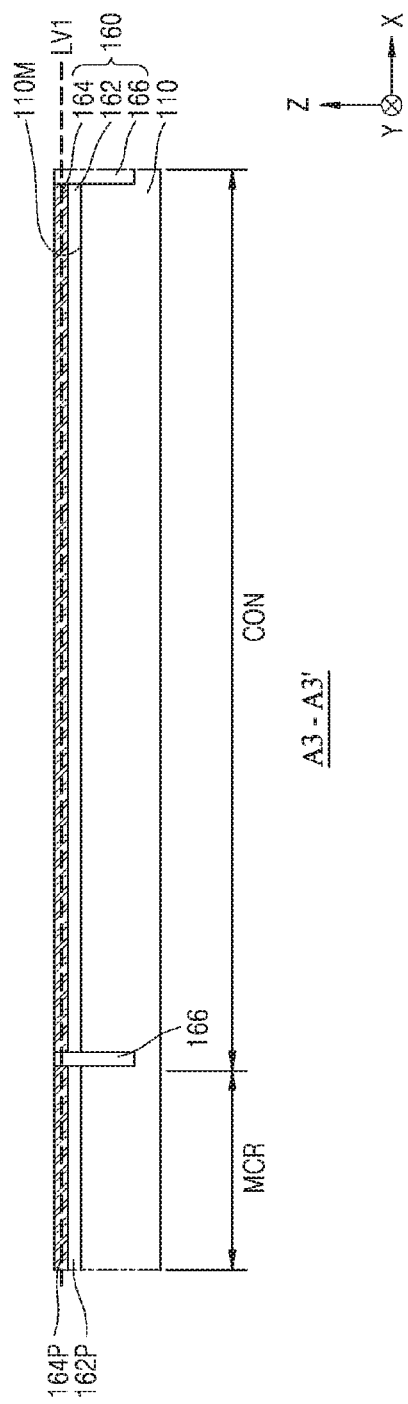
FIGS. 25A to 37B are schematic views illustrating stages in a method of manufacturing a semiconductor device according to an exemplary embodiment of the inventive concept.
Figure 25B:
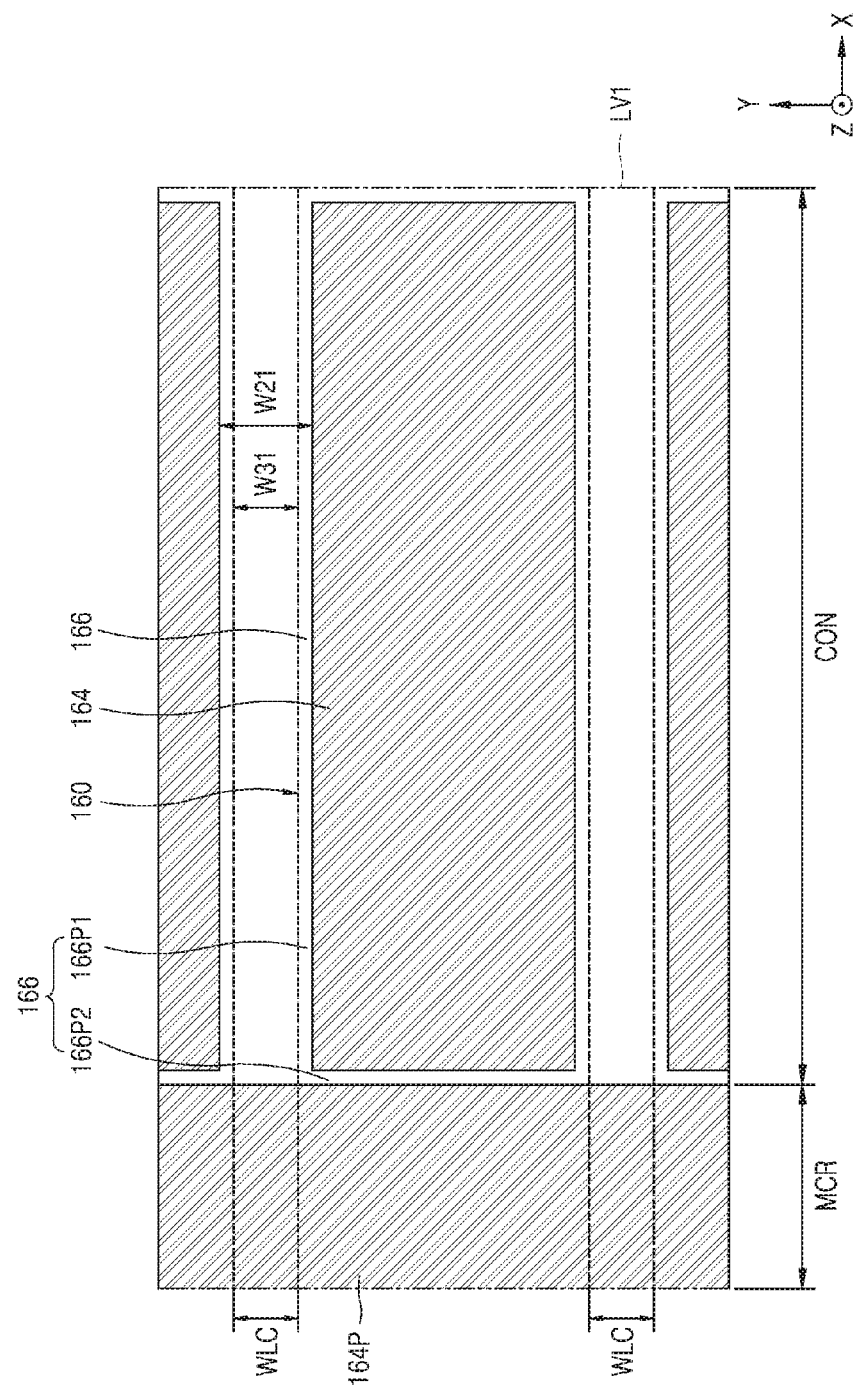

Referring to FIGS. 25A and 25B, the first insulation layer 162 and the second insulation layer 164 are formed on the main surface 110M of the substrate 110 including the memory cell region MCR and the connection region CON. For example, the first insulation layer 162 is formed on the main surface 110M and the second insulation layer 164 is formed on the first insulation layer 162. For example, the second insulation layer 164 may be formed using a material having an etch selectivity with respect to the first insulation layer 162. For example, the first insulation layer 162 may include silicon oxide, and the second insulation layer 164 may include silicon nitride.

Thereafter, in the connection region CON, portions of the second insulation layer 164, the first insulation layer 162, and the substrate 110 are removed to form first removed regions, and then the first removed regions are filled with an insulating material to form the etch stop layer 166. In an embodiment, as shown in FIG. 25B, the etch stop layer 166 includes the first portion 166P1 vertically overlapped with the word line cut region WLC and extending in the first horizontal direction (X direction) and the second portion 166P2 extending in the second horizontal direction (Y direction) in a portion of the connection region CON adjacent the memory cell region MCR. In an exemplary embodiment, the first portion 166P1 of the etch stop layer 166 has a width W21 in the second horizontal direction (Y direction) greater than a width W31 of the word line cut region WLC in the second horizontal direction (Y direction).

A portion of the first insulation layer 162 and a portion of the second insulation layer 164 that remain in the memory cell region MCR after the etch stop layer 166 is formed may be referred to as the first sacrificial layer 162P and the second sacrificial layer 164P, respectively.

Figure 26:
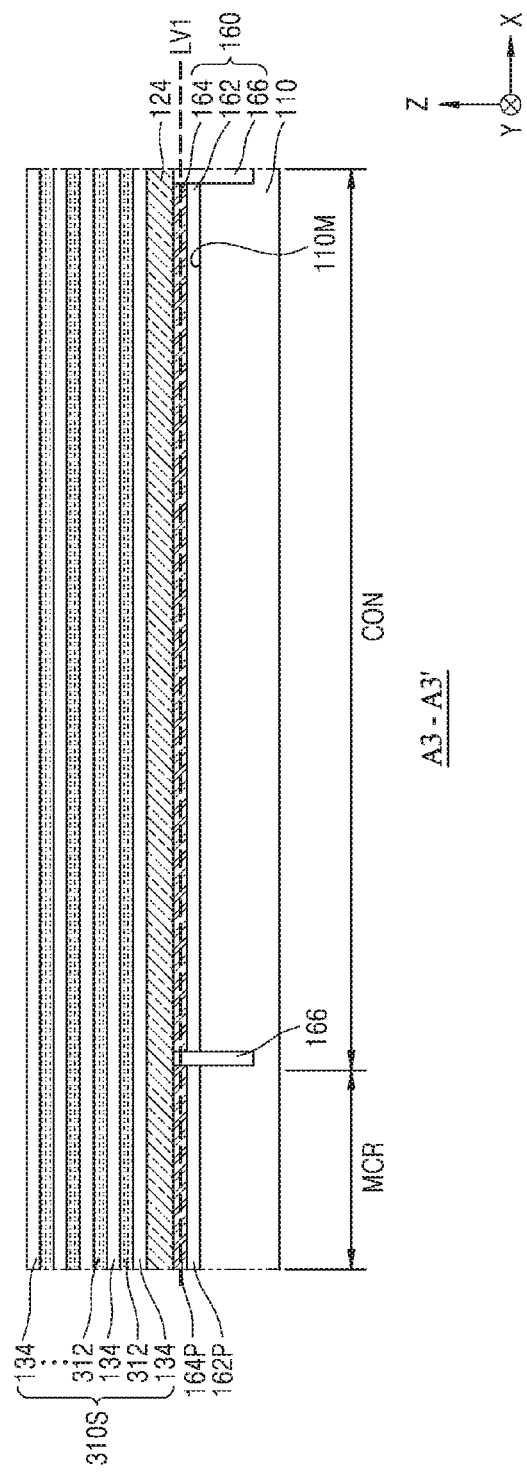

Referring to FIG. 26, a lower mold stack 310S is formed on the second sacrificial layer 164P and the insulating separation structure 160. In an embodiment, the lower mold stack 310S includes a plurality of lower insulation layers 134 and a plurality of lower sacrificial layers 312 that are alternately disposed. In some embodiments, the plurality of lower insulation layers 134 may include an insulating material, such as silicon oxide, or silicon oxynitride, and the plurality of lower sacrificial layers 312 may include silicon nitride, silicon oxynitride, doped polysilicon, or undoped polysilicon.

Figure 27:
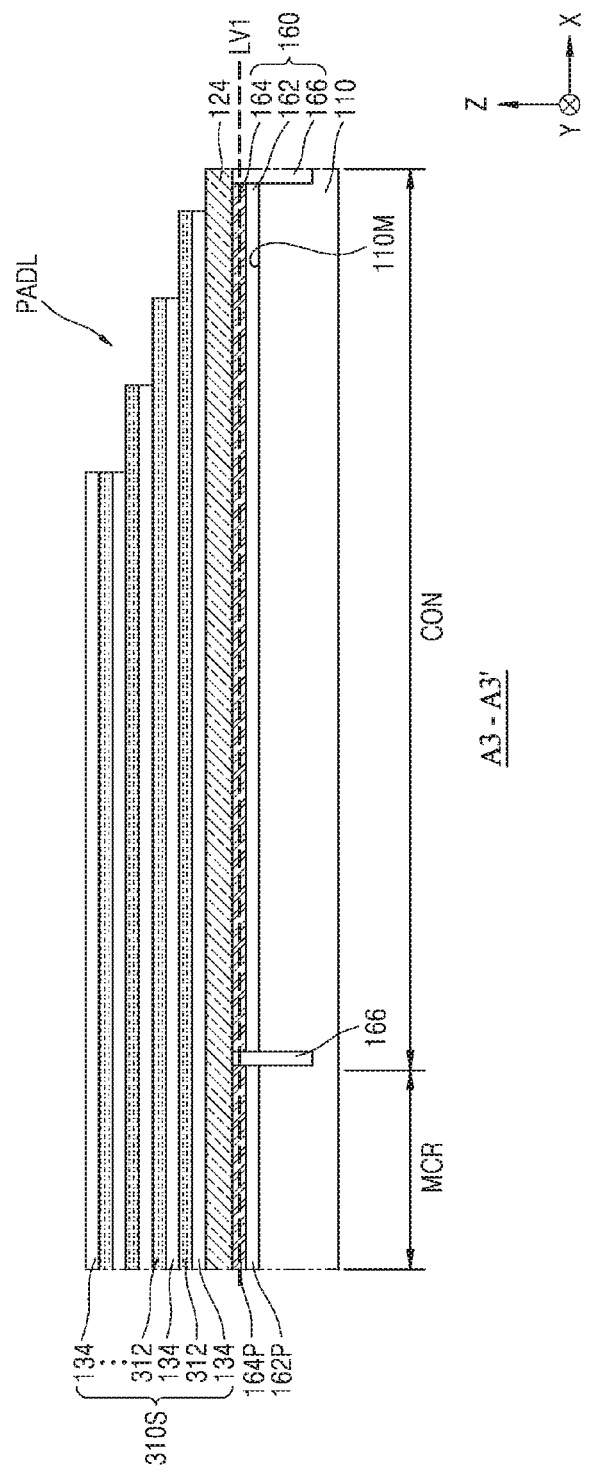

Referring to FIG. 27, the lower mold stack 310S is sequentially patterned in the connection region CON to form a lower pad part PADL. In some embodiments, the lower pad part PADL may be formed in a step form having a level difference along the first horizontal direction (X direction). In an exemplary embodiment, a first portion of a first width of a first pair of insulation layers 162 and 164 disposed on the second semiconductor layer 124 is removed, and a second portion of a second width of a second pair of insulation layers 162 and 164 disposed on the first pair is removed to form a step shape, where the second width is larger than the first width.

Figure 28A:
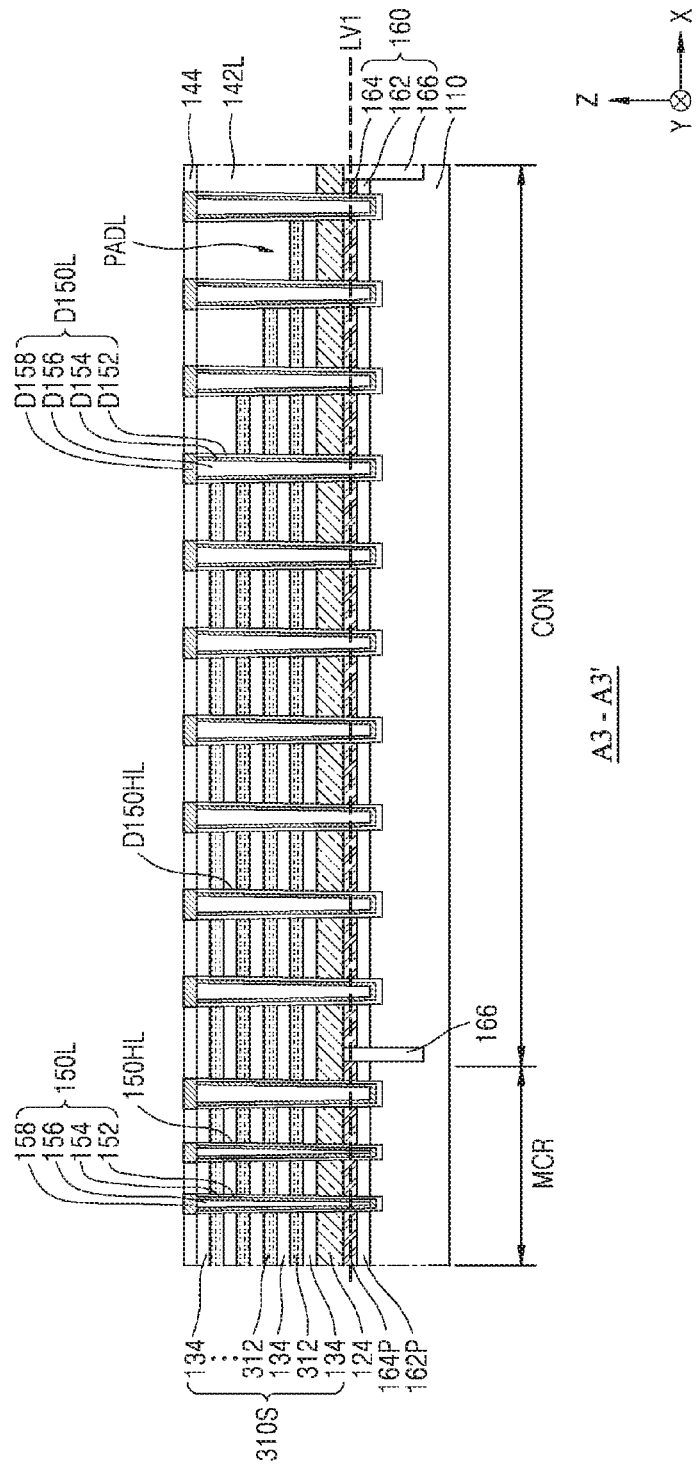
Figure 28B:
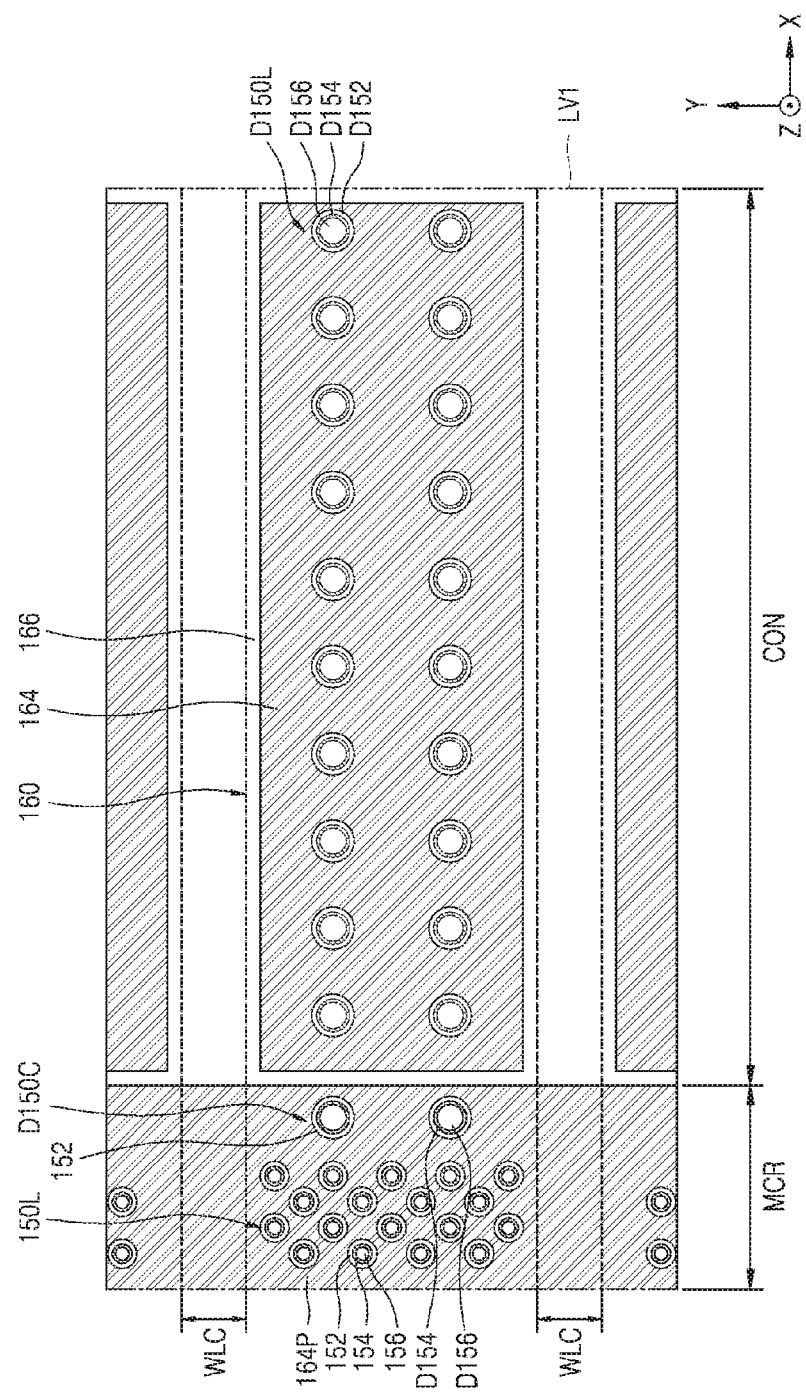

Referring to FIGS. 28A and 28B, the lower cover insulation layer 142L is formed to cover the lower pad part PADL. The lower cover insulation layer 142L may include an insulation material, such as silicon oxide or silicon oxynitride. The first interlayer insulation layer 144 is formed on the lower cover insulation layer 142L.

In the memory cell region MCR and the connection region CON, the lower channel hole 150HL and the lower dummy channel hole D150HL are formed in the lower mold stack 310S. While the gate insulation layer 152, the channel layer 154, and the buried insulation layer 156 are sequentially formed on an inner surface of the lower channel hole 150HL, the dummy gate insulation layer D152, the dummy channel layer D154, and the dummy buried insulation layer D156 are sequentially formed on an inner surface of the lower dummy channel hole D150HL. Upper portions of the gate insulation layer 152, the channel layer 154, and the buried insulation layer 156 in the lower channel hole 150HL and upper portions of the dummy gate insulation layer D152, the dummy channel layer D154, and the dummy buried insulation layer D156 in the lower dummy channel hole D150HL are removed to form second removed regions, and then the conductive plug 158 and the dummy conductive plug D158 are formed in the second removed regions to block entrances of the lower channel hole 150HL and the lower dummy channel hole D150HL, respectively. Thus, the lower channel structure 150L and the lower dummy channel structure D150L may be formed in the lower channel hole 150HL and the lower dummy channel hole D150HL, respectively.

Figure 29:
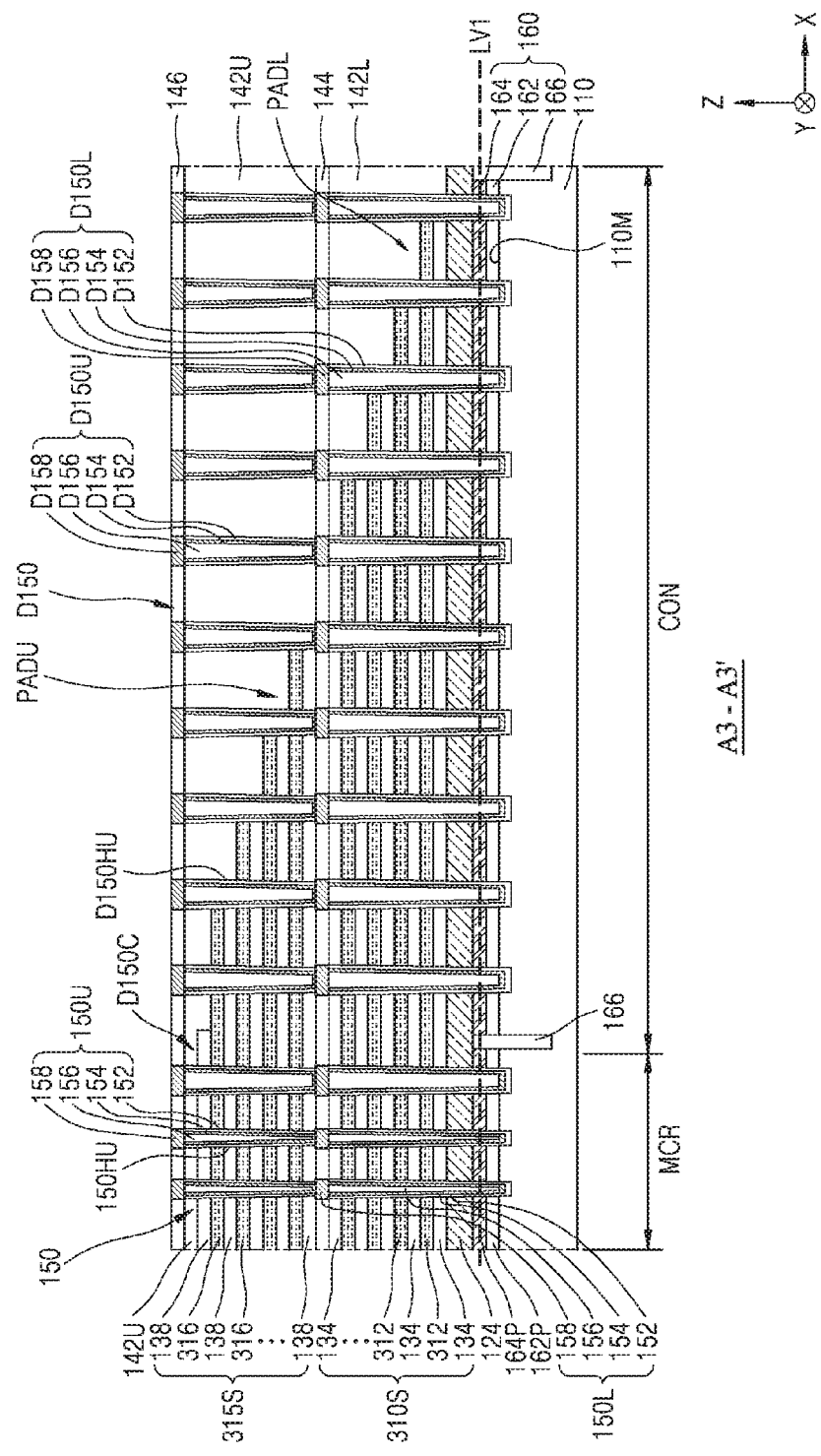

Referring to FIG. 29, the plurality of upper insulation layers 138 and a plurality of upper sacrificial layers 316 are alternately formed on the first interlayer insulation layer 144 to form an upper mold stack 315S. In the connection region CON, the upper mold stack 315S may be sequentially patterned to form an upper pad part PADU, and then the upper cover insulation layer 142U and the second interlayer insulation layer 146 are formed to cover the upper pad part PADU.

Thereafter, in the memory cell region MCR and the connection region CON, the upper channel hole 150HU and the upper dummy channel hole D150HU are respectively formed in the upper mold stack 315S. The upper channel structure 150U and the upper dummy channel structure D150U are formed in the upper channel hole 150HU and the upper dummy channel hole D150HU, respectively. The upper channel structure 150U and the upper dummy channel structure D150U may be formed by a similar method to that of forming the lower channel structure 150L and the lower dummy channel structure D150L.

Thereafter, a portion of an uppermost upper sacrificial layer 316 may be removed in the memory cell region MCR, and then the string separating insulation layer 174 may be formed to fill the removed region. The removal of the portion of the uppermost upper sacrificial layer 316 may include removing a portion of the second interlayer insulation layer 146 coinciding with the portion of the uppermost upper sacrificial layer 316.

Figure 30:
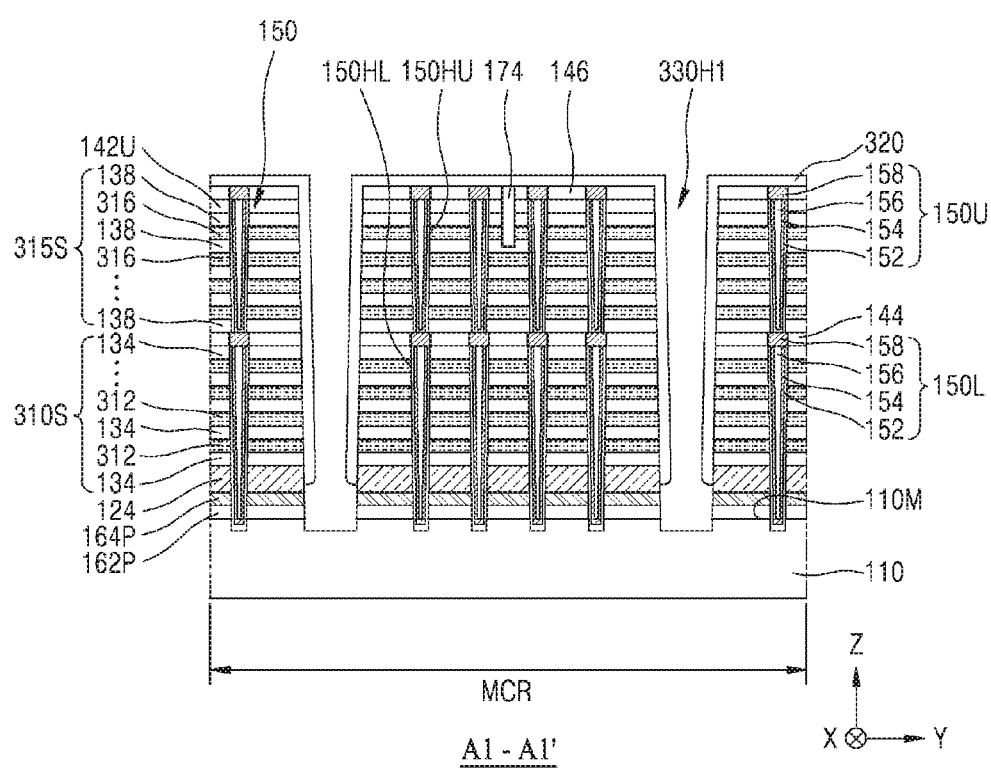
Figure 31A:
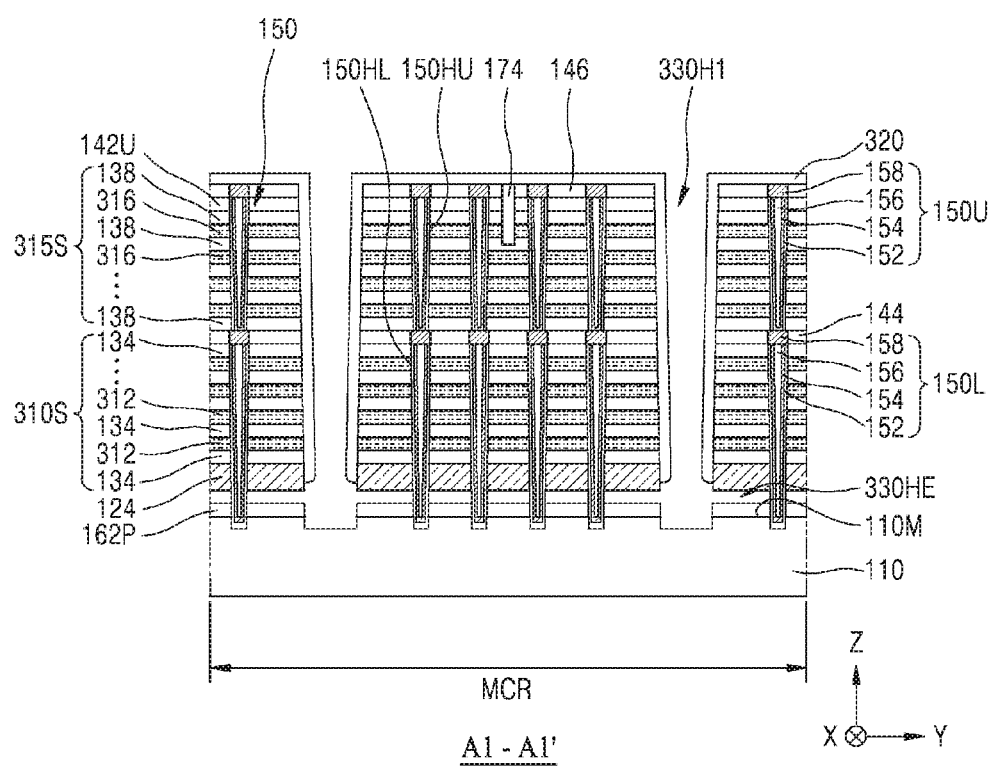
Figure 31B:
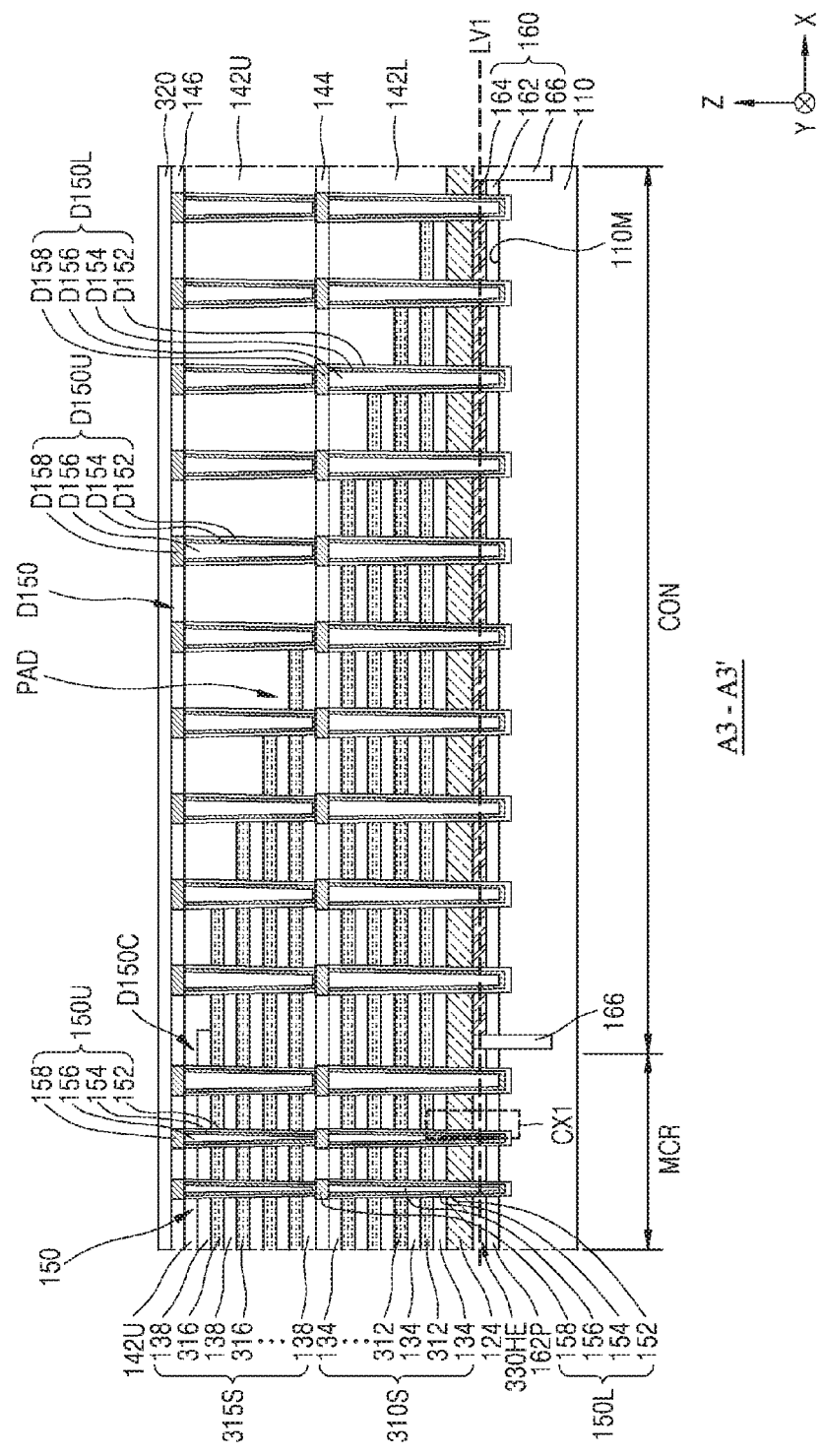
Figure 31C:
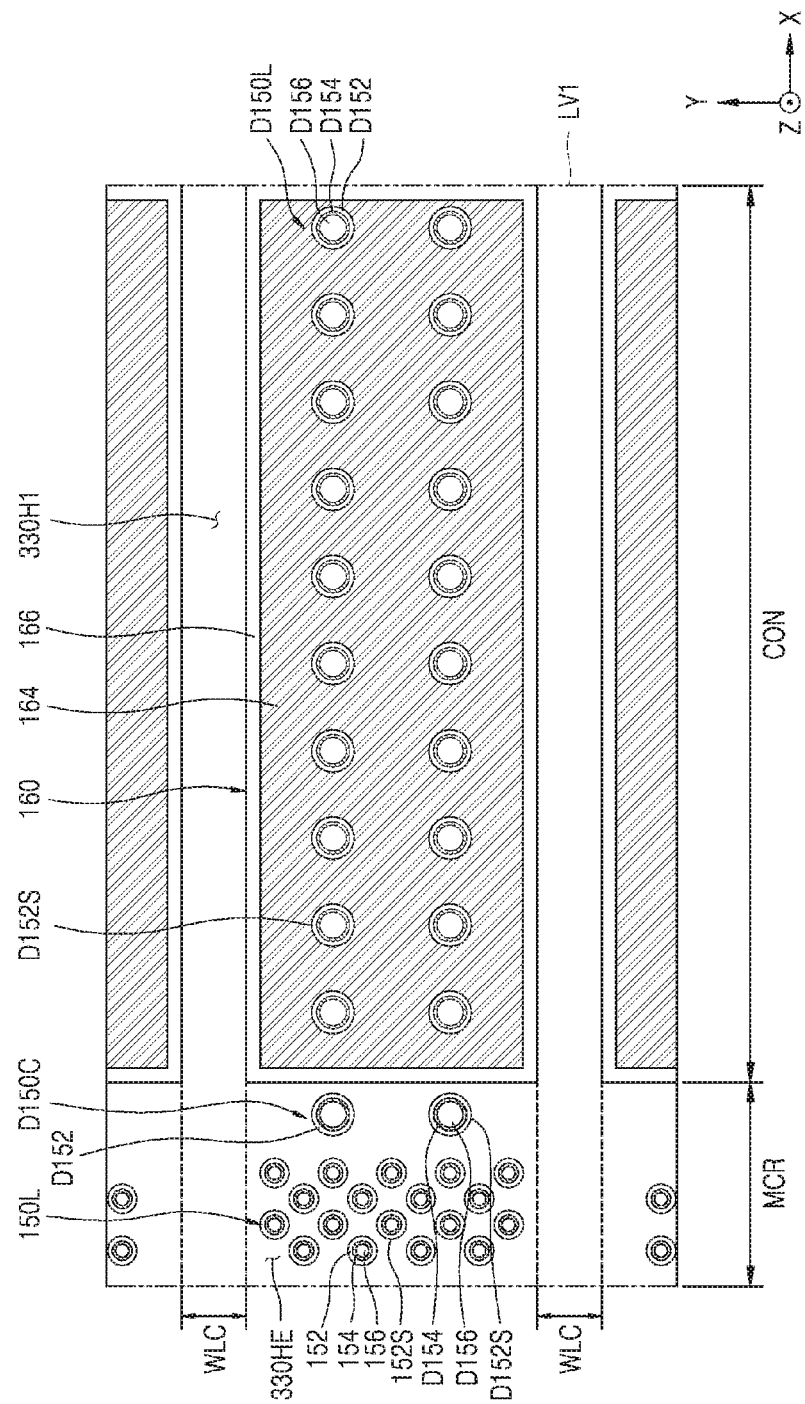
Figure 31D:
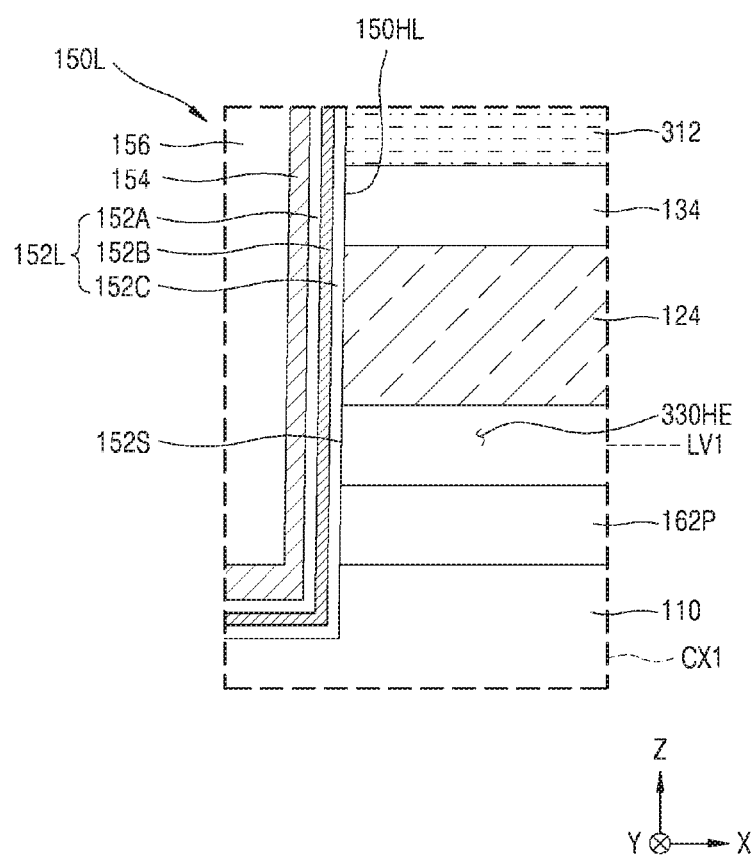

Referring to FIG. 30, a mask pattern is formed on the second interlayer insulation layer 146, and then portions of the upper mold stack 315S and the lower mold stack 310S are removed to form a word line cut opening 330H1. For example, the mask may be used to remove portions of the upper mold stack 315S and the lower mold stack 310 and to retain remaining portions of the upper mold stack 315S and the lower mold stack 310. In an exemplary embodiment, an upper surface of the substrate 110 may be exposed on a bottom surface of the word line cut opening 330H1.

A cover layer 320 is formed to cover an upper surface of the second interlayer insulation layer 146 and a sidewall of the word line cut opening 330H1. In some embodiments, the cover layer 320 may be formed using a material having poor step coverage characteristic, and thus the cover layer 320 is not disposed on the first sacrificial layer 162P and the second sacrificial layer 164P exposed on a sidewall of the word line cut opening 330H1, but the inventive concept is not limited thereto.

Referring to FIGS. 31A, 31B, 31C, and 31D, the second sacrificial layer 164P exposed on the sidewall of the word line cut opening 330H1 is removed to form a lateral opening 330HE in the region from which the second sacrificial layer 164P is removed. In the memory cell region MCR, a sidewall 152S (see FIG. 31D) of the gate insulation layer 152 of the lower channel structure 150L is exposed by the lateral opening 330HE. In addition, in the memory cell region MCR, a sidewall D152S of the dummy gate insulation layer D152 of the cell dummy channel structure D150C may be exposed by the lateral opening 330HE.

In some embodiments, the removal process of the second sacrificial layer 164P may be a wet etching process using a phosphoric acid solution as an etchant. In the removal process of the second sacrificial layer 164P, the etch stop layer 166 may be exposed on the sidewall of the word line cut opening 330H1 in the connection region CON, whereas the second insulation layer 164 surrounded by the etch stop layer 166 having the etch selectivity with respect to the second sacrificial layer 164P is not exposed to the etch environment.

Figure 32:
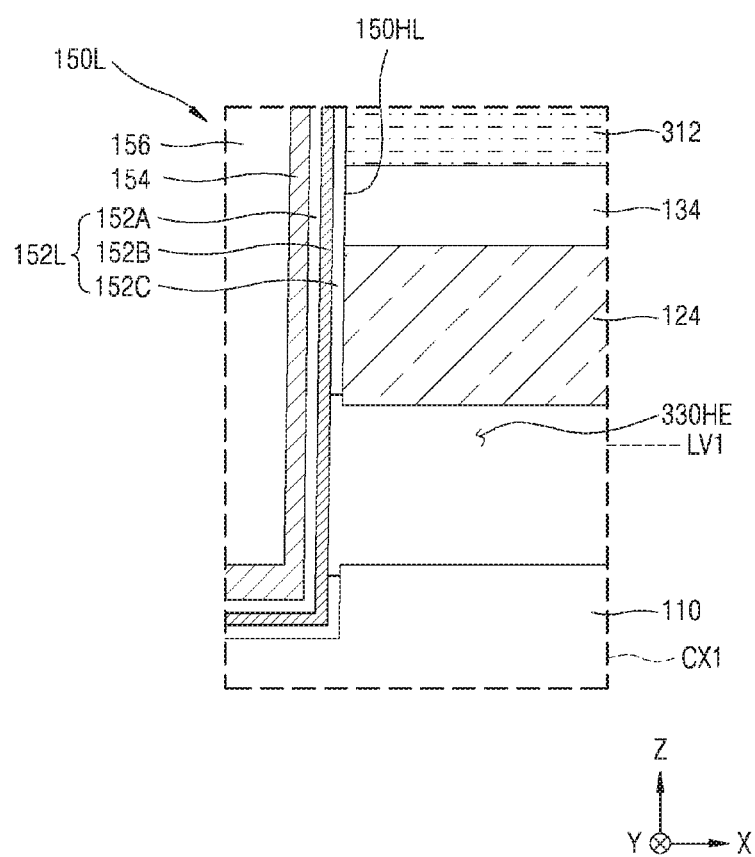

Referring to FIG. 32, the first sacrificial layer 162P and a portion of the blocking insulation layer 152C exposed by the lateral opening 330HE may be removed. For example, the first sacrificial layer 162P and a portion of the blocking insulation layer 152C shown in FIG. 31D may be removed to create the view shown in FIG. 32.

Figure 33:
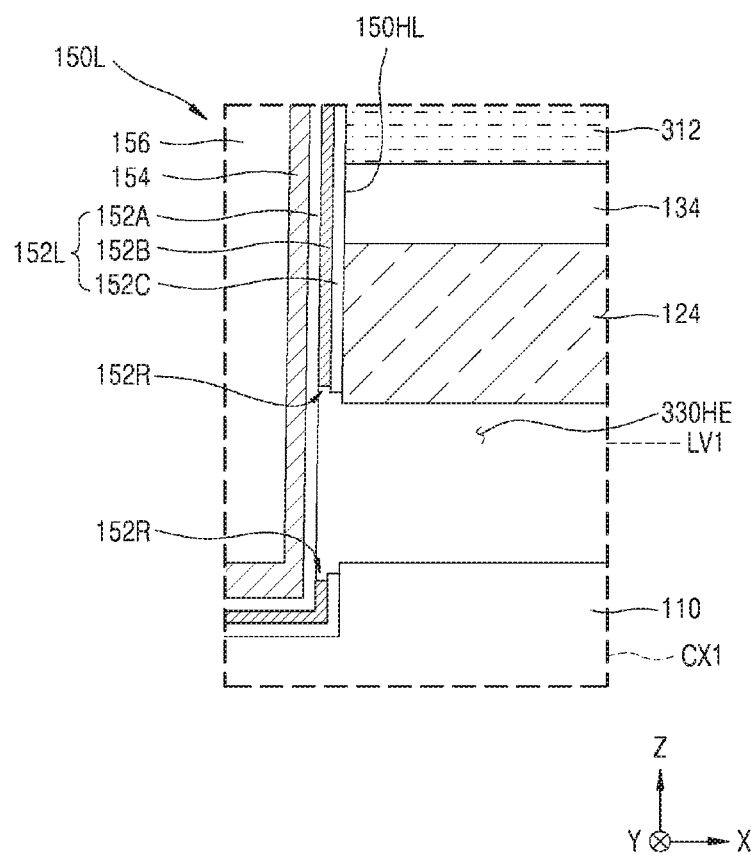

Referring to FIG. 33, a portion of the charge storage layer 152B exposed by the lateral opening 330HE may be removed. For example, a portion of the charge storage layer 152B shown in FIG. 32 as being exposed by the lateral opening 330HE may be removed to create the view shown in FIG. 33. At that time, an edge portion of the charge storage layer 152B exposed by the lateral opening 330HE may be further etched to form a gate insulation layer recess region 152R extending upward and downward from the lateral opening 330HE.

Figure 34:
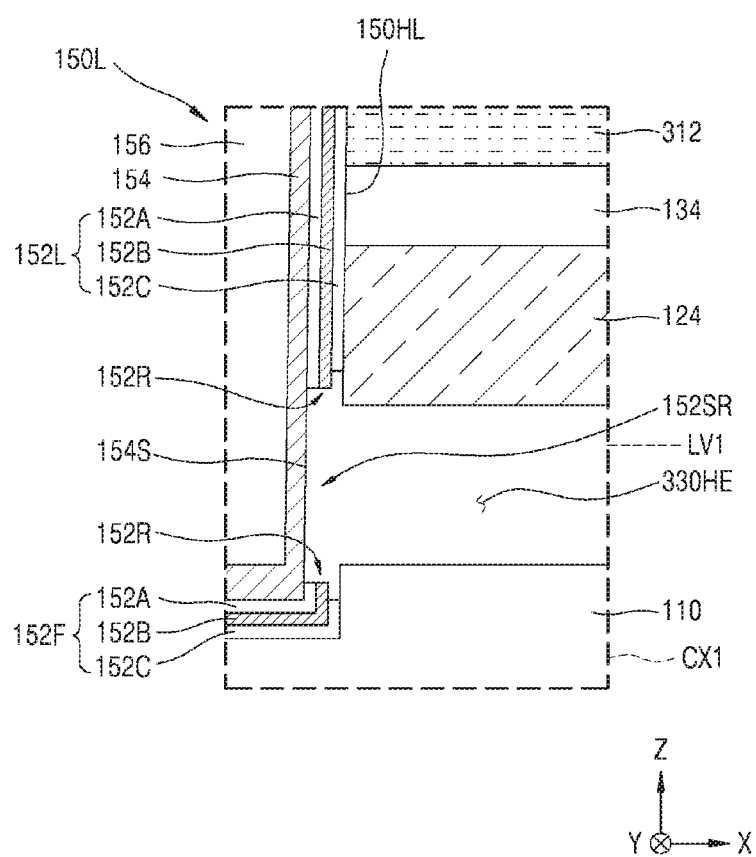

Referring to FIG. 34, a portion of the tunneling insulation layer 152A exposed by the lateral opening 330HE may be removed to expose the sidewall 154S of the channel layer 154. For example, a portion of the tunneling insulation layer 152A shown in FIG. 33 as being exposed by the lateral opening 330HE may be removed. Thus, the gate insulation layer separation region 152SR surrounded by the lateral opening 330HE may be formed, and the gate insulation layer 152 may be separated into the lower gate insulation layer 152L and the floor gate insulation layer 152F by the gate insulation layer separation region 152SR. At that time, an edge portion of the blocking insulation layer 152C exposed by the lateral opening 330HE may be further etched. For example, the blocking insulation layer 152C may be etched so that it does not extend pass the charge storage layer 152B.

Figure 35A:
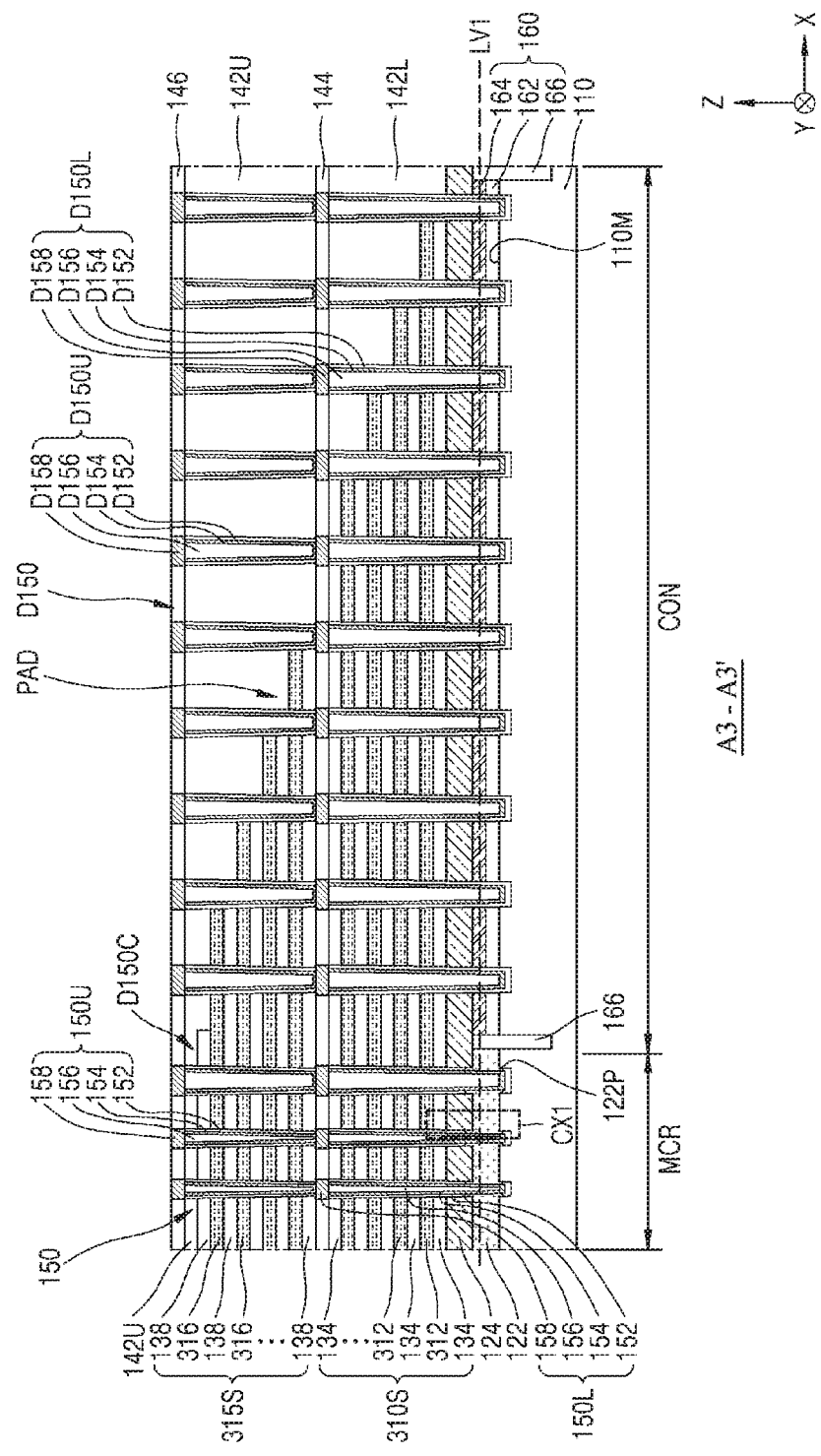
Figure 35B:
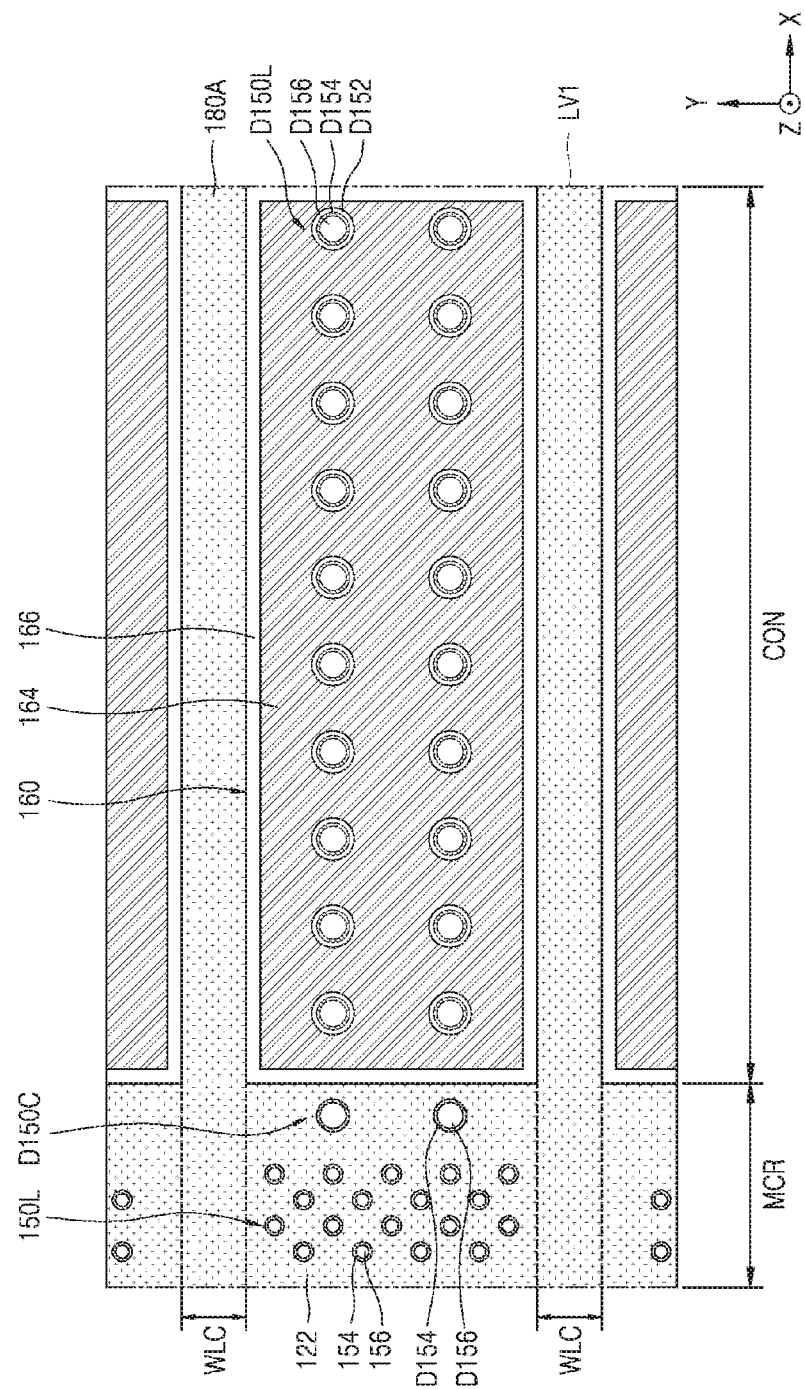
Figure 35C:
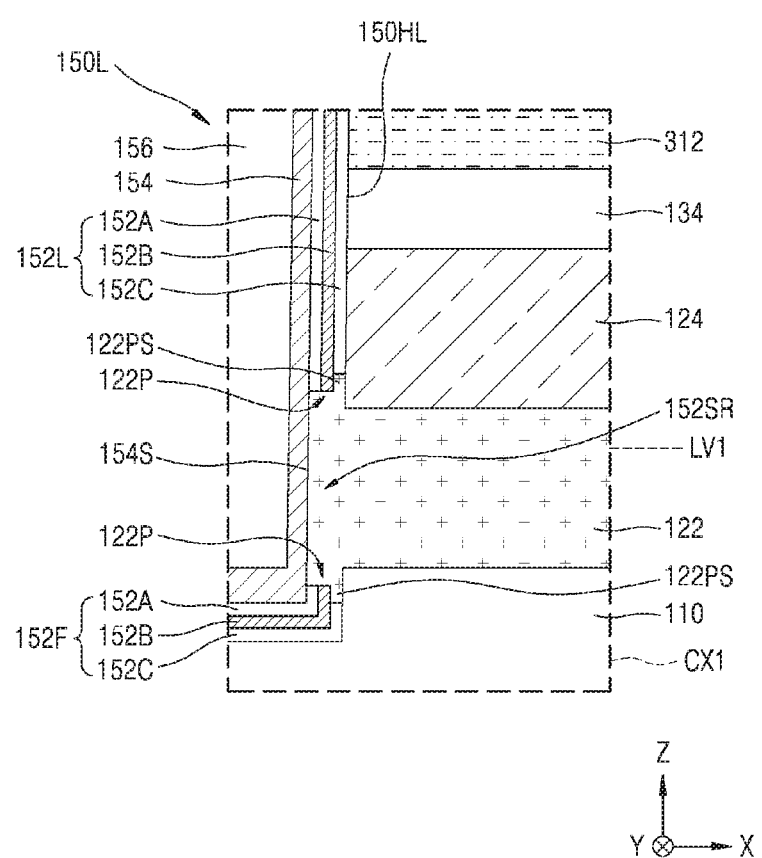

Referring to FIGS. 35A, 35B, and 35C, the first semiconductor layer 122 is formed in the word line cut opening 330H1 and the lateral opening 330HE. The first semiconductor layer 122 may be formed to fill the gate insulation layer separation region 152SR and the lateral opening 330HE shown in FIG. 34 between the substrate 110 and the second semiconductor layer 124 and to contact the sidewall 154S of the channel layer 154. A portion of the first semiconductor layer 122 may fill the gate insulation layer recess region 152R shown in FIG. 34, thus forming the protrusion 122P shown in FIG. 35A and FIG. 35C. The protrusion step 122PS shown in FIG. 35C may be formed at the protrusion 122P due to the gate insulation layer recess region 152R.

Figure 36:
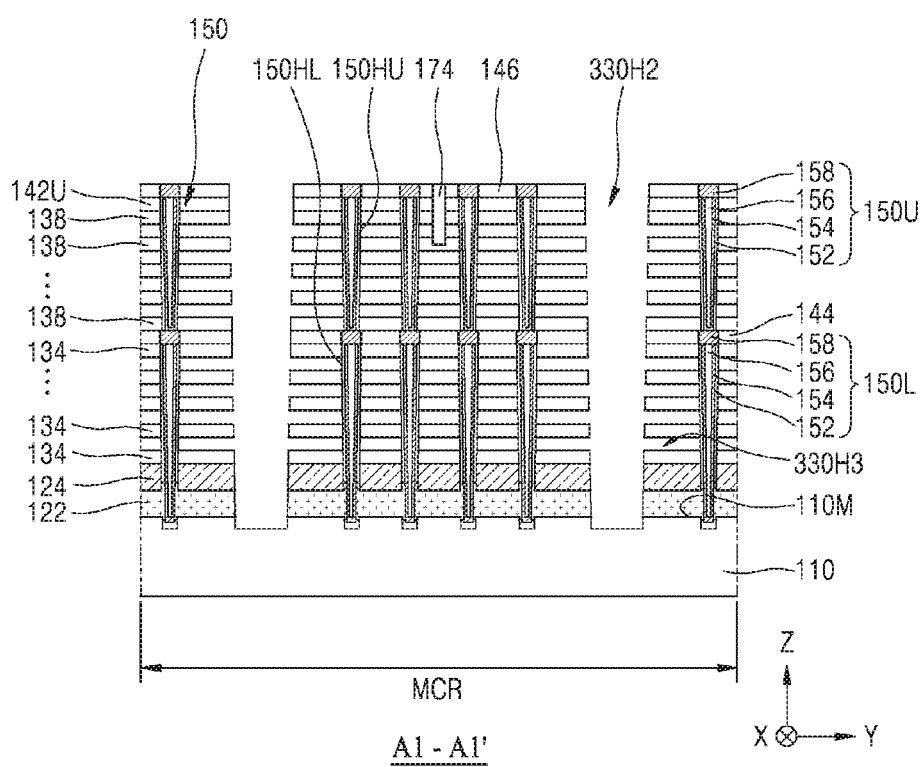

Referring to FIG. 36, a portion of the first semiconductor layer 122 and the cover layer 320 (refer to FIG. 31A) formed on the sidewall of the word line cut opening 330H1 may be removed to form a word line cut opening 330H2.

The lower sacrificial layers 312 (see 312 of FIG. 31A) and the upper sacrificial layers (see 316 of FIG. 31A) exposed by the word line cut opening 330H2 may be removed to form a mold opening 330H3. Sidewalls of the plurality of channel structures 150 and sidewalls of the plurality of dummy channel structures D150 may be exposed by the mold opening 330H3.

Figure 37A:
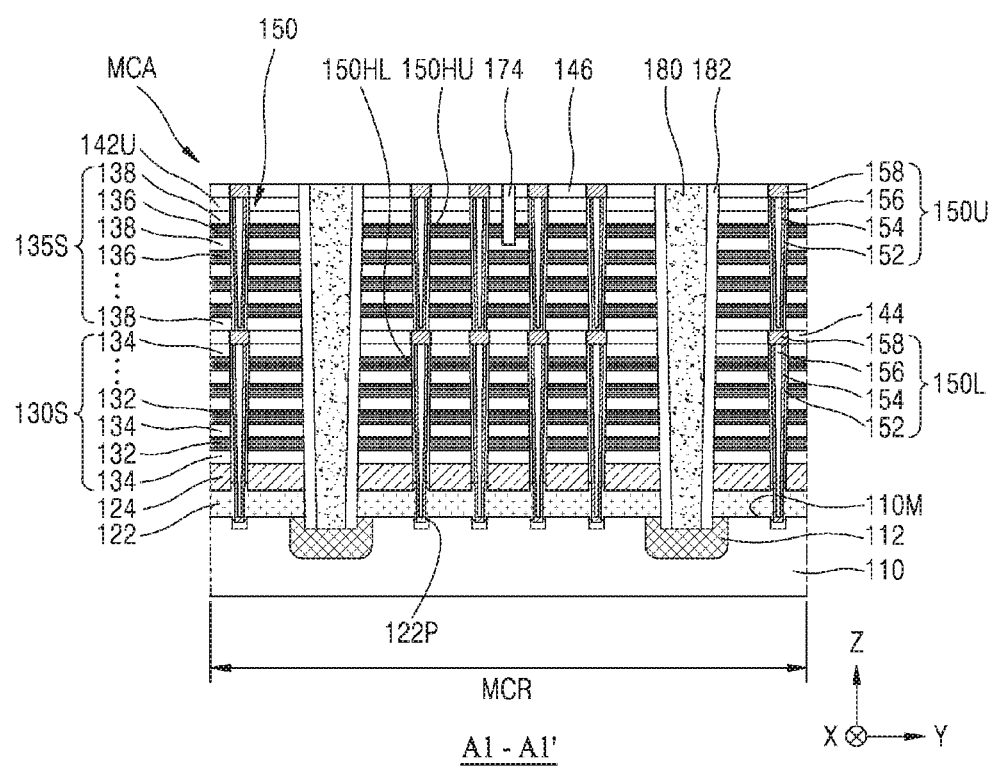
Figure 37B:
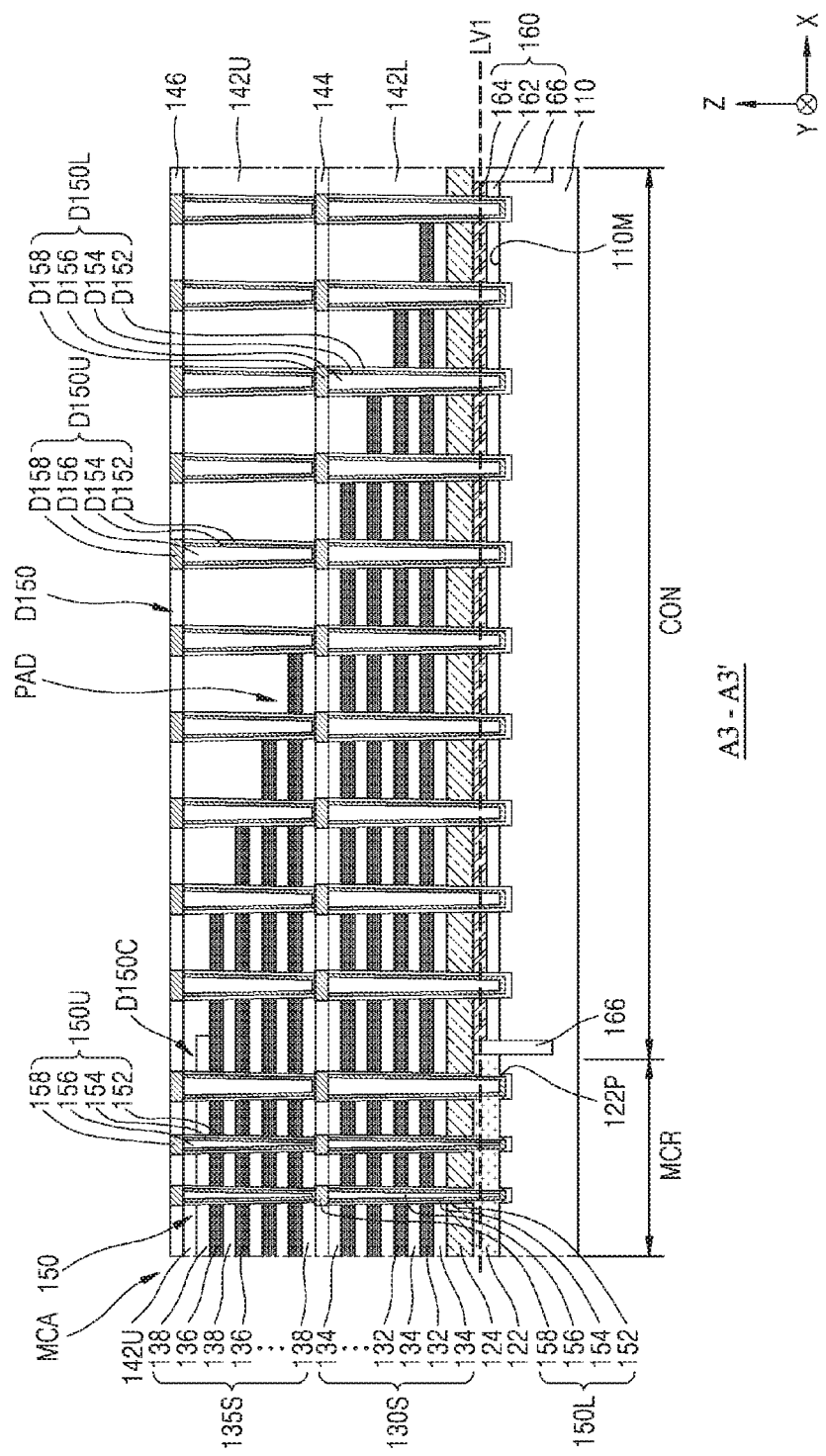

Referring to FIGS. 37A and 37B, the word line cut opening 330H2 and the mold opening 330H3 may be filled with metal. The metal in the word line cut opening 330H2 may be removed to form the lower gate electrodes 132 between the lower insulation layers 134 of the lower mold stack 310S and to form the upper gate electrodes 136 between the upper insulation layers 138 of the upper mold stack 315S.

Impurities may be injected into the substrate 110 through the word line cut opening 330H2 shown in FIG. 36 to form the common source region 112 shown in FIG. 37A in the substrate 110 exposed by the word line cut opening 330H2.

The insulation spacers 182 and the common source line 180 shown in FIG. 37A may be formed on a sidewall of the word line cut opening 330H2 shown in FIG. 36.

Referring again to FIG. 3, the upper interlayer insulation layer 148 may be formed on the second interlayer insulation layer 146. The bit line contact BLC may penetrate the upper interlayer insulation layer 148 to be electrically connected to the channel structure 150. The bit line BL may be formed on the upper interlayer insulation layer 148 to be connected to the bit line contact BLC and may extend in the second horizontal direction (Y direction).

The semiconductor device 100 may be completed by performing the aforementioned processes.

According to the above-described method of manufacturing the semiconductor device 100, since the etch stop layer 166 is formed on the substrate 110 in the connection region CON, the second insulation layer 164 in the connection region CON may be prevented from being removed during the process of removing the second sacrificial layer 164P in the memory cell region MCR. Accordingly, the dummy channel layer D154 of the dummy channel structure D150 is not electrically connected to the common source line 180. In the process of forming the dummy channel structure D150, even though a defect or a failure occurs in the dummy channel layer D154 or the dummy gate insulation layer D152, the channel structure 150 in the memory cell region MCR may normally operate, and thus the semiconductor device 100 may have an improved reliability.

While the present inventive concept has been shown and described with reference to exemplary embodiments thereof, it will be understood by those of ordinary skill in the art that various changes in form and details may be made thereto without departing from the spirit and scope of the present inventive concept.

What is claimed is:

1. A semiconductor device comprising:
   a substrate including a memory cell region and a connection region;
   a plurality of gate electrodes stacked on the substrate;
   a channel structure disposed in the memory cell region and penetrating the plurality of gate electrodes, the channel structure including a channel layer extending in a vertical direction perpendicular to an upper surface of the substrate;
   a dummy channel structure disposed in the connection region and penetrating the plurality of gate electrodes, the dummy channel structure including a dummy channel layer extending in the vertical direction;
   a first semiconductor layer disposed in the memory cell region and disposed between the substrate and a lowermost one of the plurality of gate electrodes, the first semiconductor layer at least partially surrounding the channel structure; and
   an insulating separation structure disposed between the substrate and the lowermost one of the plurality of gate electrodes and at least partially surrounding the dummy channel layer,
   wherein the insulating separation structure comprises a first insulation layer disposed on the substrate and an etch stop layer covering a sidewall of the first insulation layer.

2. The semiconductor device according to claim 1, wherein the first semiconductor layer at least partially surrounds the channel layer, and the insulating separation structure is spaced apart from the dummy channel layer.

3. The semiconductor device according to claim 1, wherein the channel structure further includes a gate insulation layer disposed on a sidewall of the channel layer, the gate insulation layer is not disposed between the first semiconductor layer and the channel layer, the dummy channel structure further includes a dummy gate insulation layer disposed on a sidewall of the dummy channel layer, and at least a portion of the dummy gate insulation layer is disposed between the insulating separation structure and the dummy channel layer.

4. The semiconductor device according to claim 3, wherein a gate insulation layer separation region is disposed at a lower portion of the channel structure, the first semiconductor layer contacts the channel layer in the gate insulation layer separation region, and the dummy gate insulation layer covers a sidewall and a lower surface of the dummy channel layer.

5. The semiconductor device according to claim 1, further comprising a second semiconductor layer disposed between the first semiconductor layer and the lowermost gate electrode and disposed between the insulating separation structure and the lowermost gate electrode, wherein the second semiconductor layer at least partially surrounds the channel structure and the dummy channel structure.

6. The semiconductor device according to claim 1, wherein the insulating separation structure further comprises:
   a second insulation layer disposed on the first insulation layer; and
   the etch stop layer covering a sidewall of the second insulation layer.

7. The semiconductor device according to claim 6, wherein the etch stop layer has a first sidewall and a second sidewall, the first sidewall of the etch stop layer contacts the sidewall of the first insulation layer and the sidewall of the second insulation layer, and the second sidewall of the etch stop layer contacts the first semiconductor layer.

8. The semiconductor device according to claim 1, wherein an upper surface of the insulating separation structure is located at a same level as or at a higher level than an upper surface of the first semiconductor layer, and a lower surface of the insulating separation structure is located at a same level as or a lower level than the upper surface of the substrate.

9. The semiconductor device according to claim 6, wherein the etch stop layer includes a plurality of openings, and at least a portion of the dummy channel structure and at least a portion of the second insulation layer are disposed in each of the plurality of openings.

10. The semiconductor device according to claim 6, further comprising a common source line disposed in a word line cut region of the substrate and penetrating the plurality of gate electrodes, wherein the etch stop layer includes a first portion vertically overlapped with the common source line.

11. The semiconductor device according to claim 10, wherein a width of the first portion of the etch stop layer is greater than a width of the word line cut region.

12. The semiconductor device according to claim 10, wherein a part of the first portion of the etch stop layer is disposed between the common source line and the second insulation layer.

13. The semiconductor device according to claim 1, wherein the first insulation layer covering a first portion of a sidewall of the dummy channel structure; and
   the etch stop layer covering a second portion of the sidewall of the dummy channel structure.

14. The semiconductor device according to claim 13, further comprising, in the connection region, a third semiconductor layer disposed between the substrate and the lowermost gate electrode and connected to the first semiconductor layer, wherein the third semiconductor layer surrounds the etch stop layer and the first insulation layer, wherein the third semiconductor layer is spaced apart from the dummy channel structure.

15. A semiconductor device comprising:
   a substrate including a memory cell region and a connection region; a plurality of gate electrodes stacked on the substrate;
   a channel structure disposed in the memory cell region and penetrating the plurality of gate electrodes, the channel structure including a channel layer and a gate insulation layer extending in a vertical direction perpendicular to an upper surface of the substrate;
   a dummy channel structure disposed in the connection region and penetrating the plurality of gate electrodes, the dummy channel structure including a dummy channel layer and a dummy gate insulation layer extending in the vertical direction;
   a first semiconductor layer disposed in the memory cell region and disposed between the substrate and a lowermost one of the plurality of gate electrodes; and
   a second semiconductor layer disposed between the first semiconductor layer and the lowermost gate electrode, wherein the second semiconductor layer at least partially surrounds the channel structure and the dummy channel structure;
   wherein a gate insulation layer separation region is formed at a lower portion of the channel structure, the first semiconductor layer at least partially surrounds the channel layer in the gate insulation layer separation region, and the dummy gate insulation layer covers an outer sidewall of the dummy channel layer.

16. The semiconductor device according to claim 15, further comprising, in the connection region, an insulating separation structure disposed between the substrate and the lowermost gate electrode and at least partially surrounding the dummy channel structure, wherein at least a portion of the dummy gate insulation layer is disposed between the insulating separation structure and the dummy channel layer.

17. The semiconductor device according to claim 16, a wherein the second semiconductor layer is further disposed between the insulating separation structure and the lowermost gate electrode, wherein an upper surface of the insulating separation structure is located at a same level as or at a higher level than a lower surface of the second semiconductor layer, and a lower surface of the insulating separation structure is located at a same level as or at a lower level than the upper surface of the substrate.

18. The semiconductor device according to claim 16, wherein the insulating separation structure comprises:
   a first insulation layer disposed on the substrate;
   a second insulation layer disposed on the first insulation layer; and
   an etch stop layer covering a sidewall of the first insulation layer and a sidewall of the second insulation layer, the etch stop layer contacting the first semiconductor layer.

19. The semiconductor device according to claim 18, further comprising a common source line disposed in a word line cut region of the substrate and penetrating the plurality of gate electrodes, wherein the etch stop layer includes a first portion vertically overlapped with the common source line.

20. A semiconductor device comprising:
   a substrate including a memory cell region and a connection region;
   a plurality of gate electrodes stacked on the substrate;
   a channel structure disposed in the memory cell region and penetrating the plurality of gate electrodes, the channel structure including a channel layer extending in a vertical direction perpendicular to an upper surface of the substrate;
   a dummy channel structure disposed in the connection region and penetrating the plurality of gate electrodes, the dummy channel structure including a dummy channel layer extending in the vertical direction; and
   a first semiconductor layer disposed in the memory cell region and disposed between the substrate and a lowermost one of the plurality of gate electrodes, the first semiconductor layer at least partially surrounding the channel structure,
   wherein a gate insulation layer separation region is disposed at a lower portion of the channel structure, the first semiconductor layer at least partially surrounds the channel layer in the gate insulation layer separation region, and the dummy channel structure is spaced apart from the first semiconductor layer,
   wherein the first semiconductor layer includes a first protrusion protruding upward to contact a lower gate insulation layer at a level higher than the gate insulation layer separation region and a second protrusion protruding downward to contact a floor gate insulation layer at a level lower than the gate insulation layer separation region.

* * * * *